United States Patent [19]

Todokoro et al.

[11] Patent Number: 5,412,210
[45] Date of Patent: May 2, 1995

[54] SCANNING ELECTRON MICROSCOPE AND METHOD FOR PRODUCTION OF SEMICONDUCTOR DEVICE BY USING THE SAME

[75] Inventors: Hideo Todokoro, Tokyo; Kenji Takamoto, Ome; Tadashi Otaka, Katsuta; Fumio Mizuno, Tokorozawa; Satoru Yamada, Ome; Katsuhiro Kuroda, Hachioji; Ken Ninomiya, Higashimatsuyama; Tokuo Kure, Tokyo, all of Japan

[73] Assignee: Hitachi, Ltd., Tokyo, Japan

[21] Appl. No.: 160,336

[22] Filed: Dec. 2, 1993

Related U.S. Application Data

[63] Continuation-in-part of Ser. No. 39,705, Mar. 29, 1993, abandoned, which is a continuation-in-part of Ser. No. 773,729, Oct. 9, 1991, abandoned.

[30] Foreign Application Priority Data

| | | | |
|---|---|---|---|
| Oct. 12, 1990 | [JP] | Japan | 2-272258 |
| Apr. 10, 1992 | [JP] | Japan | 4-089189 |
| Dec. 2, 1992 | [JP] | Japan | 4-323128 |

[51] Int. Cl.$^6$ ............................................. H01J 37/26
[52] U.S. Cl. ................................ 250/310; 250/306; 250/442.2
[58] Field of Search .............. 250/310, 311, 398, 399, 250/306, 307, 492.2 R

[56] References Cited

U.S. PATENT DOCUMENTS

| | | | |
|---|---|---|---|
| Re. 27,005 | 12/1970 | Wingfield et al. | 250/307 |
| 3,614,311 | 10/1971 | Fujiyasu et al. | 250/310 |
| 3,714,424 | 1/1973 | Weber | 250/399 |
| 4,426,577 | 1/1984 | Koike et al. | 250/310 |
| 4,658,137 | 4/1987 | Garth et al. | 250/310 |
| 4,733,074 | 3/1988 | Kato et al. | 250/310 |
| 5,001,350 | 3/1991 | Ohi et al. | 250/440.11 |

FOREIGN PATENT DOCUMENTS

| | | |
|---|---|---|
| 62-97246 | 5/1987 | Japan . |
| 64-48470 | 2/1989 | Japan . |
| 2050689 | 1/1981 | United Kingdom . |

OTHER PUBLICATIONS

Katz et al, "Range–Energy Relations for Electrons and the Determination of Beta–Ray End-Point Energies by Absorption", Reviews of Modern Physics, vol. 24, No. 1, Jan., 1952, pp. 28–44.

Japanese Society of Electron Microscopy, "Basis and Application of an SEM", Dec. 1, 1983. (translation).

*Primary Examiner*—Paul M. Dzierzynski
*Assistant Examiner*—Kiet T. Nguyen
*Attorney, Agent, or Firm*—Fay, Sharpe, Beall, Fagan, Minnich & McKee

[57] ABSTRACT

A technique for displaying a scanned specimen image permits non-destructive observation of a surface structure having large or precipitous unevenness, an internal structure of a specimen or a specific structure of a defect or foreign matter, which non-destructive observation has hitherto been considered to be difficult to achieve. The technique can be applied to inspection and measurement so as to economically provide devices and parts of high quality and high reliability. Thus, secondary information such as secondary electrons resulting from interaction of primary information with a specimen, the primary information being generated as a result of interaction of a scanning electron beam with the specimen, is utilized as an image signal to form an image.

70 Claims, 36 Drawing Sheets

PATTERN POSITION SHIFT

RESIST
HOLE

CONCEALED HOLE BOTTOM PART

F I G. 46A
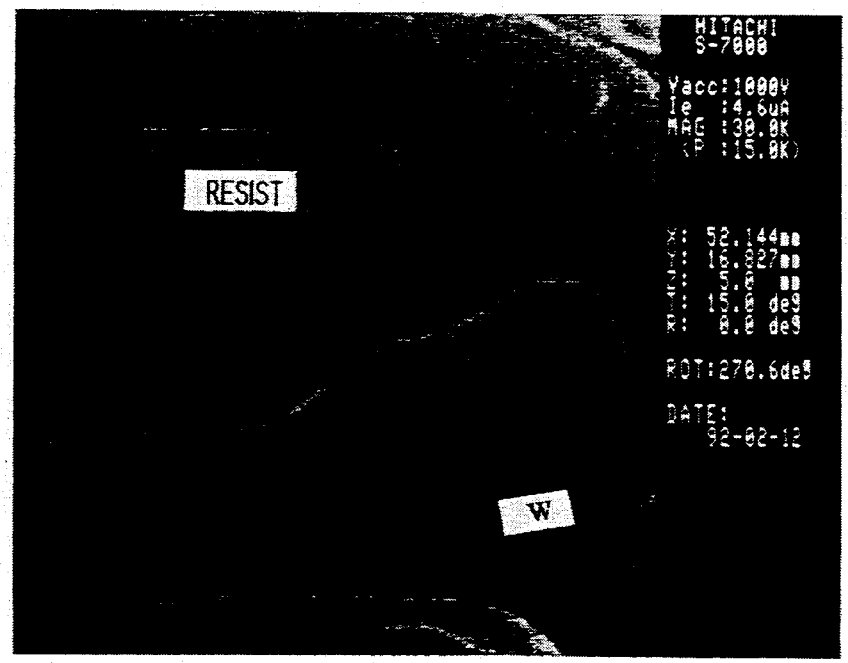
F I G. 46B
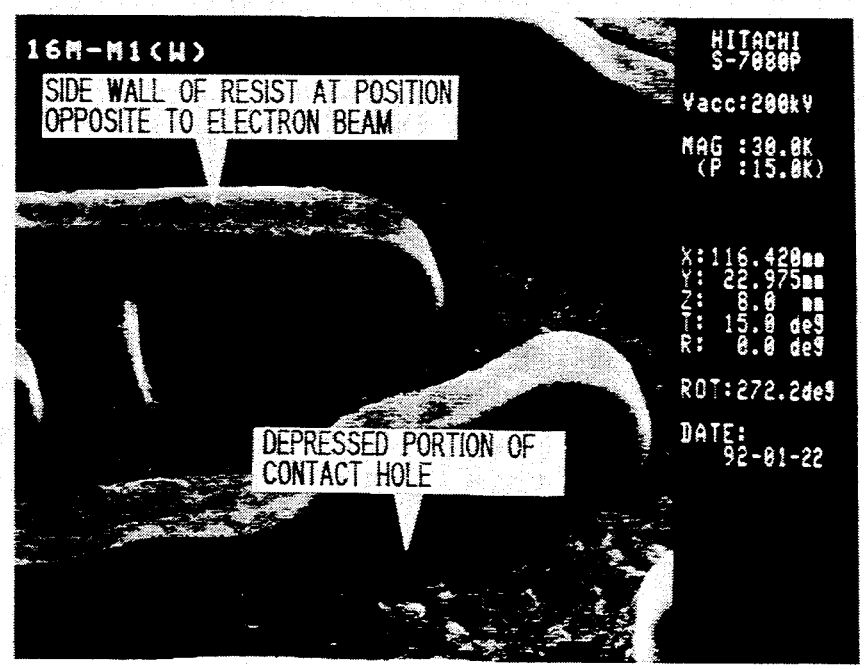

SPECIMEN IMAGE OBTAINED WITH THE PRIOR ART

UPPER-LAYER WIRING

SPECIMEN IMAGE OBTAINED WITH THE PRESENT INVENTION

A: UNDERSURFACE WIRING

F I G. 48
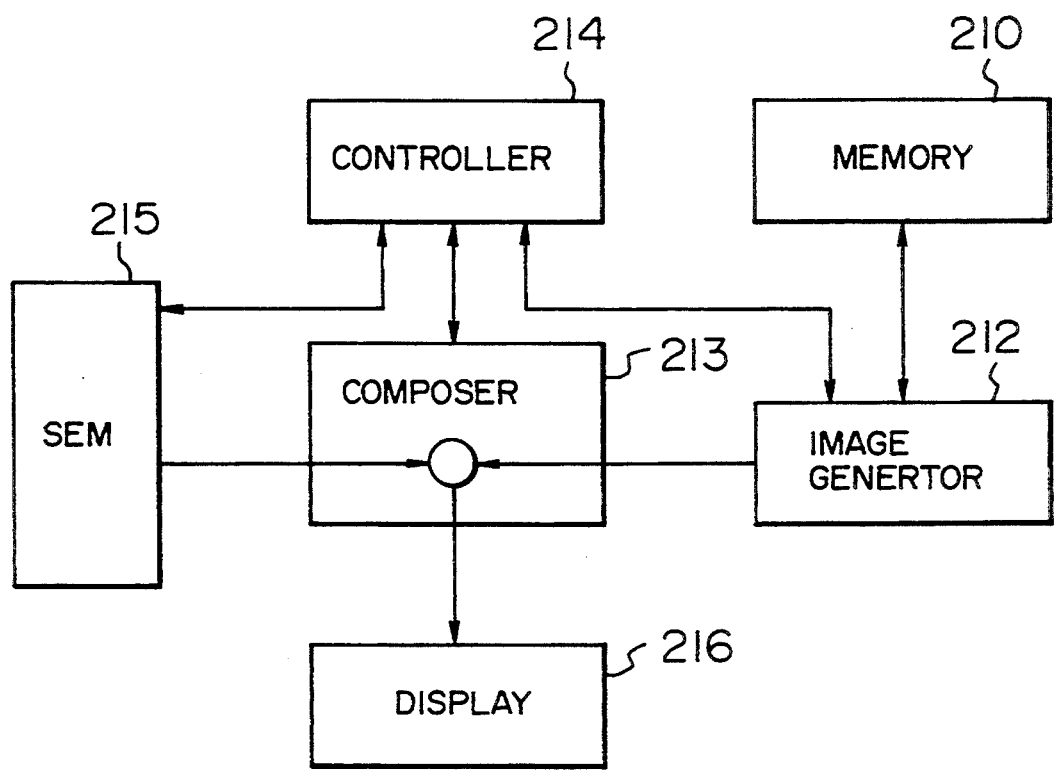

SCANNING ELECTRON MICROSCOPE AND METHOD FOR PRODUCTION OF SEMICONDUCTOR DEVICE BY USING THE SAME

This application is a continuation-in-part of application Ser. No. 08/039,705, filed Mar. 29, 1993, abandoned, which is a continuation-in-part of Ser. No. 07/773,729, filed Oct. 9, 1991, now abandoned.

BACKGROUND OF THE INVENTION

The present invention relates to an apparatus and a method of observing surface configurations by using an electron beam, and especially provides an apparatus and a method by which observation of either configurations of the bottom of a deep hole or residues therein, used frequently in semiconductor processes, can be permitted.

The scanning electron microscope, in which an electron beam is scanned on a specimen and secondary electrons generated from the specimen are detected, has been utilized widely in the fields of biology and engineering. Especially, in the semiconductor industry, high-integration formation has advanced and as a result, inspection based on optical microscopes has become impossible, and the utilization of the scanning electron microscope has been promoted. In a scanning electron microscope used for semiconductors, it is conventional to use an electron beam of low energy of 1 keV or less in order to avoid charging on insulators.

In the semiconductor industry, the scanning electron microscope is utilized for not only inspection of appearance of completed semiconductors but also inspection in mid-course of the manufacturing process. For example, it is used for inspection of appearance, inspection of dimension and inspection of through-holes in mid-course of the process.

As a result of the advancement of high-integration formation of semiconductor devices, it has become impossible for the method using the conventional scanning electron microscope to inspect openings of through-holes.

Referring to FIG. 2, problems encountered in observing a deep hole with the conventional scanning electron microscope will be described. FIG. 2 shows a case where a primary electron beam 1 of low energy irradiates a flat portion and a hole 3 of a specimen. Thanks to the absence of any obstacles, almost all of the number of secondary electrons 2 generated at the flat portion can be detected. Similarly, reflection electrons concurrently discharged can also be detected. In the case of irradiation of the hole 3, however, generated secondary electrons 2 impinge on the side wall of the hole 3 and consequently cannot escape from the hole 3 to the outside. The energy of reflection electrons is higher than that of secondary electrons but is not so high that the reflection electrons can penetrate through the side wall, and the reflection electrons are thus blocked by the side wall.

The present invention is further concerned with a method for displaying a scanning image of a specimen and an apparatus therefor. Examples of such specimens are devices and parts as represented by a semiconductor device, a photomask substrate inclusive of a multi-layer structure mask such as a phase shift mask, a display device such as a liquid crystal device or a CCD, a wiring board, a memory medium such as an optical disc, metal or polymer materials, cellular tissues and other living bodies.

Additionally, both intermediate products and finished goods are considered specimens for the purposes of the invention. The present invention handles these objects and is effective for use in observation, inspection, measurement and analysis of them or in monitoring techniques during treatment of specimens.

By way of example, in the field of observation of a fine structure of a specimen, of a scanning microscope using an electron beam having an energy level of several hundreds of eV to several tens of keV, and a transmission-type electron microscope using an electron beam of several tens of keV to several MeV, have been used for imaging a specimen and displaying the image on a specimen image display apparatus. Specimen image display techniques using the above electron microscope techniques are described in the literature; see, for example, "Fundamentals and Applications of Scanning Electron Microscope", originally edited and twice published by Kyohritsu Shuppan Kabushiki-Kaisha, May 25, 1985.

Disadvantageously, however, the conventional techniques described above have encountered difficulties in performing high-resolution or non-destructive observation of a surface structure having large unevenness or precipitous unevenness, and of an internal structure of a specimen.

SUMMARY OF THE INVENTION

FIG. 3 shows results of calculating the relationship between the aspect ratio (depth/opening diameter) of a hole and the ratio of signals escaping from the hole. A signal at the surface (aspect ratio=0) corresponds to 1. This calculation demonstrates that observation of holes of an aspect ratio exceeding 2 is impossible with the conventional scanning electron microscope.

In the present invention, in order to solve the aforementioned problems, a primary electron beam is used which has such high energy as to allow reflection electrons generated at the bottom of a hole to penetrate through the side wall of the hole.

Referring to FIG. 1, the principle of observation of deep holes by using a primary electron beam of high energy will be described.

A case where a primary electron beam 4 of high energy irradiates a surface portion resembles a case where the surface portion is irradiated with low energy. However, in the case of irradiation on the interior of a hole, the circumstances differ greatly. Secondary electrons 2 are absorbed by the side wall but reflection electrons 6 penetrate through the side wall to escape from the surface. When the reflection electrons 6 pass through the surface, they generate secondary electrons 5. Since the secondary electrons 5 and reflection electrons 6 have more information about the bottom of the hole 3, an image of the interior of the hole can be obtained by detecting these electrons.

Thus, one of the aspects of the present invention resides in that the primary electron beam has sufficiently high energy to allow reflection electrons to penetrate through the side wall, thereby permitting observation of the bottom of high-aspect-ratio holes, which observation has hitherto been impossible. The primary electron beam penetrates an insulating layer ($\leq 2$ μm thickness) of a semiconductor device when it has energy sufficient for the reflection electrons to penetrate through the side wall. This results in allowing electrons in the insulating layer to move, i.e. the layer becomes conductive so that the layer is not subject to charging. Further, when the primary electron beam has an energy level as defined by the present invention, the beam itself does not cause the insulating layer of the semiconductor device to become charged.

Another object of the invention is to provide a scanned specimen image displaying technique capable of performing non-destructive observation of an internal structure of a specimen, and of a specific structure of a defect, foreign material or the like.

Still another object of the invention is to provide a scanned specimen image displaying technique capable of performing high-resolution observation of a surface structure having large unevenness or precipitous unevenness, and an internal structure of a specimen.

Still another object of the invention is to provide a scanned specimen image displaying technique capable of obtaining three-dimensional information and tomographic information about surface and internal structures of a specimen.

Still another object of the invention is to provide a scanned specimen image displaying technique capable of performing high-resolution observation of an electrically non-conductive specimen.

Still another object of the invention is to provide a specimen whose surface and internal structures can be observed more effectively under the irradiation of a high-energy particle beam.

The above and other objects and novel features of the invention will become apparent from the description contained in the present specification and from the accompanying drawings.

Typical forms of the invention to be disclosed in the present application will be outlined briefly as below.

More particularly, in the present invention, a scanning particle beam is irradiated to a specimen to act on the specimen so as to produce primary information such as back-scattered particles, X-rays and photons, and the primary information also interacts with the specimen to produce secondary information, such as secondary electrons and photons, which is used as a main signal for formation of an image.

In a particular embodiment, an electron beam having an energy level of 50 keV or more is used as the scanning particle beam, and secondary electrons or electromagnetic waves resulting from interaction of reflection electrons, generated under the irradiation of the electron beam, with the specimen are detected as the secondary information to construct a scanned specimen image.

In another embodiment, at least one of tomographic and three-dimensional images is formed on the basis of a plurality of specimen images observed with two or more particle beams which are different from each other in at least one of incident energy and angle.

When a part standing for a target or object to be observed, that is, a test part, is inside a specimen, a scanning particle beam must have an energy which satisfies the following requirements: the scanning particle beam must be able to transmit or penetrate through the specimen to reach the test part, and the scanning particle beam must interact with the test part to generate primary information such as back-scattered particles. The primary information itself must have sufficient energy to also interact with the specimen so as to generate secondary information such as secondary electrons.

The energy required for the scanning particle beam, that is, the primary beam, is determined by taking into consideration the degree of back scattering and forward scattering of a part of the specimen present on a path of the beam (i.e., a part overlying the test part). The degree of scattering depends on well known parameters (density, thickness and the like of that part).

In back scattering, it is preferable that the test part have a large contrast to its surroundings, and especially to the beam passage part overlying the test part. In order to establish contrast in back scattering between the two parts, they are made to be different from each other in density and/or crystalline structure. As an alternative, contrast can also be set up between them by featuring, for example, by roughening the surface of the test part irradiated with the primary beam.

The test part observation method can be applied to a measurement process for a semiconductor device including at least one of the following steps:

a first step is for reading identification information of a specimen and setting corresponding working command, working conditions and working data on the basis of the read identification information;

a second step is for automatically prosecuting designated location, designated time and a designated operation for a designated specimen on the basis of designated working command, working conditions and working data;

a third step is for displaying a plurality of images such as a specimen image and a three-dimensional configuration simultaneously;

a fourth step is for performing transfer and input/output of information, such as working command, working conditions, working data, detected image data and measured data, on line between the apparatus and external units;

a fifth step is for performing alignment and/or positioning between a particle beam and the specimen;

a sixth step is for measuring the size and/or position coordinates of a pattern formed at least on the specimen surface or inside the specimen;

a seventh step is for automatically measuring one or more patterns inside the designated specimen;

an eighth step is for performing retrieval between a measured value of one or more patterns inside the designated specimen and a preset desirable standard value to decide whether the pattern is acceptable or unacceptable, and for processing the specimen on the basis of the result of the decision in accordance with a preset procedure;

a ninth step is for measuring the kind, number and size of a specimen structure such as a particle or a domain which exists on the specimen surface and/or inside the specimen;

a tenth step is for determining the results of the statistical treatment of measured values in step 7 and displaying, storing or delivering the results as necessary;

an eleventh step is for changing the irradiation direction and/or the irradiation angle of the particle beam relative to the specimen;

a twelfth step is for performing at least one of display, storage and delivery of three-dimensional information on the basis of a plurality of specimen images which are observed at two or more designated irradiation angles;

a thirteenth step is for performing at least one of the change of irradiation energy of the particle beam, particle adjustment such as focusing needed upon the change of irradiation energy and insuring of the same field of view upon the change of irradiation energy;

a fourteenth step is for constructing a tomographic image and/or a three-dimensional image on the basis of a plurality of specimen images observed with two or more particle beams having at least one of designated incident energy level and incident angle and performing at least one of display, storage and delivery of the tomographic image and/or three-dimensional image;

a fifteenth step is for applying at least one of a single or a plurality of voltages, currents and electrical signals to the specimen;

a sixteenth step is for performing, for the designated specimen, at least one of the operations of applying a predetermined voltage and/or current and/or electrical signal, fetching a specimen image of a designated area at a designated time point, comparing a specimen image of the designated area fetched presently with a specimen image of the designated area fetched previously to detect a change, fetching lapse data of a designated parameter of the specimen at a designated time point, and performing display and/or storage and/or delivery of the image data and/or lapse data;

a seventeenth step is for setting a desired temperature of the specimen;

an eighteenth step is for performing, for the designated specimen, at least one of the operations of heating the specimen to a predetermined temperature, fetching a specimen image of a designated area at a designated time point, comparing a specimen image of the designated area fetched presently with a specimen image of the designated area fetched previously to detect a change, fetching lapse data of a designated parameter of the specimen at a designated time point, and performing display and/or storage and/or delivery of the image data and/or lapse data;

a nineteenth step is for performing, for the designated specimen, at least one of the operations of fetching a specimen image of a designated area and comparing it with a previously designated storage image, extracting a difference between the specimen image and the storage image, detecting position coordinates of a differing part inside the specimen, and performing display and/or storage and/or delivery of an image of the differing part and position coordinate data;

a twentieth step is for performing, for the designated specimen, etching and/or film deposition at a designated single part or a plurality of designated parts inside the specimen;

a twenty-first step is for analyzing, for the designated specimen, analyzing a designated single part or a plurality of designated 1° parts inside the specimen; and a twenty-second step is for annealing the specimen after it is observed under the irradiation of the particle beam.

The present invention described thus far has been achieved on the basis of the following novel knowledge acquired by the present inventors.

The present inventors have found that phenomena as below take place in observation of such a specimen as a semiconductor device conducted using, as a particle beam, a high-energy scanning electron beam of 50 keV or more:

(1) Non-destructive observation of the internal structure of a specimen can be permitted.

Generally, a transmission-type electron microscope is used to observe, for example, the internal structure of a specimen. For observation with the transmission-type electron microscope, the specimen must take the form of a thin film, and there results destructive observation of the specimen.

(2) High-resolution observation of an electrically non-conductive specimen can be ensured without impairing freshness of the specimen.

A scanning electron microscope is used to carry out, for example, high-resolution observation of a specimen configuration. In the case of observation of the electrically non-conductive material with the scanning electron microscope, for the sake of preventing degradation of image quality due to charge up, a method is adopted wherein gold or carbon is vapor-deposited on the specimen surface to permit surface leakage of accumulated charge, or a low-energy electron beam of about 1 keV is used to increase the secondary electron emission amount so as to decrease the charge-up amount.

The vapor-deposition of a conductive film leads to destructive observation which impairs the original physical property of the specimen, and the observation with the low-energy electron beam suffers from low resolution.

As a result of analysis of these phenomena, it has been found that the internal structure can be observed by the present invention in accordance with the mechanism described below with reference to FIG. 4.

Generally, in a scanning electron microscope, a scanning electron beam 101a with an energy ranging from about several hundreds of eV to 30 keV is irradiated to a specimen 102 and, as a result of interaction of the electron beam 101a with the specimen 102, primary information (reflection electrons 103a, secondary electrons 105a and an electromagnetic wave 104a representative of X-rays and photons) is generated, of which the secondary electrons 105a are mainly used as an image signal to display a specimen image. Of course, X-rays, photons, absorbed electrons or transmitted electrons may be used as an image signal.

On the other hand, in the case of a high-energy scanning electron beam 101b of the present invention, the electron beam can intrude into the specimen 102 to reach a part thereof at a large depth owing to the high energy on the beam, and is then scattered by an internal structure 106 to produce scattered (reflection) electrons 103b, which escape from the specimen 102. When leaving the specimen 102, the scattered electrons 103b also interact with the specimen 102 to produce secondary information such as an electromagnetic wave 104b and secondary electrons 105b.

When evaluating secondary electrons from the viewpoint of an image signal, the secondary electrons 105b representative of the secondary information are richer than the secondary electrons 105a representative of the primary information. Accordingly, a specimen image based on a secondary electron signal can permit observation corresponding to the amount of scattered electrons 103b which in turn cause secondary electrons 105b; that is, observation of the internal structure 106.

FIG. 5 shows a model of the relationship between the scanning electron beam energy and the secondary electron discharge amount.

Generally, secondary electrons 105b representative of the primary information have a peak emission amount at an energy level around several hundreds of eV, and, in the energy level range exceeding that level, the emission amount decreases as the energy increases.

On the other hand, secondary electrons 105b representative of the secondary information will not be discharged before the beam energy exceeds a threshold value Eb. When the energy exceeds Eb, secondary electrons 105b begin to discharge and the emission amount increases gradually as the energy increases.

To explain, when the energy of electron beam 101b is low, electrons 103b back scattered at the test part 106 fail to have energy sufficient to reach the surface of the specimen, and secondary electrons generated at a depth by the scattered electrons 103b likewise cannot escape from the specimen surface. More specifically, when the depth of the test part 106 as measured from the specimen surface is d, the electron beam 101b at energy $E_0$ is considered to have a range approximating 2d. The depth allowed for secondary electrons to escape is about 100A and most secondary electrons have an energy level of about 10 eV.

On the other hand, the amount of scattered electrons depends on the scattering direction in accordance with the cosine law. More particularly, where an electron beam 101b is vertically incident to a specimen 102 as shown in FIG. 6, for instance, the amount of scattered electrons has a maximum value in a direction at which the scattering angle $\theta$ is 0° and decreases as $\theta$ increases to eventually approach 0 at $\theta = 90°$. Scattered electrons in a direction at which $\theta$ is from 0° to 60° occupy about 90% of the total amount of scattered electrons, and scattered electrons within this range may be considered as an image signal.

From the above standpoint, the energy of a scanning electron beam used in observation of a semiconductor device will be studied below.

Generally, a semiconductor device is composed of an element section of, for example, transistors and capacitors, and a wiring layer formed on the element section. The device structure has a depth which depends on the number of wiring layers and which amounts to an average value of about 5 $\mu$m.

On the other hand, when scattered electrons allowed to contribute to an image signal are considered to be those within a scattering angle range of from 0° to 60° in accordance with the above discussion, it can be understood from FIG. 7 that the range or length of path of the scanning electron beam which allows scattered electrons to escape from the specimen surface must be 15 $\mu$m or more.

In order to convert a range of 15 $\mu$m into the energy of the scanning electron beam, the following equation by Katz and Penfold (Revs. Modern Phys., Vol. 24:28 (1952)) is used.

$$R = 0.412 E^{1.265 - 0.0954 \ln (E/1000)}$$

(10 keV < E < 3000 keV)

where R is the range (mg/cm$^2$) and E is the energy of the electron beam (keV). The density of the specimen (unit:mg/cm$^3$) is added to this range.

The relationship between the range R and the energy E is shown in FIG. 8. The range R is substantially proportional to the square of the energy $E^2$.

When the conversion is carried out by using Si of 2.34 g/cm$^3$ density as a typical semiconductor material and Al of 2.69 g/cm$^3$ density as a typical wiring material, the range is about 17 $\mu$m in Si and about 15 $\mu$m in Al when the energy of the electron beam is 50 keV.

This proves that an electron beam energy level of 50 keV or more is required for observation of the semiconductor device. The numerical value amounting to 50 keV is sufficiently compatible with practical, empirical observation.

An electrically non-conductive material can be observed under the fresh condition for the reason that most of an electron beam intrudes into a specimen to reach a large depth thereof or to pass through the specimen and as a result, the charge-up amount near the specimen surface can be minimized.

Contrast of a specimen image to be observed is of a complexity which is not only attributable to the internal structure of the specimen as described above, but also to the surface structure of the specimen and the difference in material between parts of the specimen.

For example, when the surface is uneven as shown in FIG. 9, the total amount and the directional dependency of reflection electrons 103a reflected from the specimen surface are different in comparison with the case where a scanning electron beam 101b irradiates a flat portion of the specimen, the case where the irradiation is to a stepped portion and the case where the irradiation is to a portion close to a stepped portion. Thus, differences result for the number of electrons intruding into the specimen which result in scattered electrons 103b, for the amount of secondary electrons generated as an image signal and for the ratio between secondary electrons 105a representative of the primary information and secondary electrons 105b representative of the secondary information.

Further, as shown in FIG. 10, the number of electrons intruding into the specimen which result in scattered electrons, as well as the total number of detectable secondary electrons and the ratio between secondary electrons 105a and secondary electrons 105b, are different in comparison with the case where specimen materials 102a and 102b are different from each other and the case where a foreign material 102c is adhered to the specimen surface.

Furthermore, even for an embodiment as shown in FIG. 11, where there are shielding structures 102d and 102e against an electron beam 101b, if the shielding structures have a thickness or a depth through which the electron beam 101b can pass, there is contrast even at normally-shadowy locations D and E, which are irradiated with the transmitting electron beam, and resulting specimen images can be observed. In other words, this indicates that even in the presence of very large unevenness or precipitous unevenness on the specimen surface, the interior or bottom of a depression and the side of a raised portion, as well as a surface portion shadowed by the raised portion, can be observed.

BRIEF DESCRIPTION OF THE DRAWINGS

FIG. 46A shows an image photograph of a semiconductor wafer formed with a resist pattern which is photographed with the scanning electron microscope according to teachings of the prior art in connection with a specimen having a bank structure;

FIG. 46B shows an image photograph of the FIG. 46A semiconductor wafer photographed according to teachings of the present invention;

FIG. 48 is a block diagram for explaining still another embodiment of the observing method.

DESCRIPTION OF THE PREFERRED EMBODIMENTS

Figure 12:
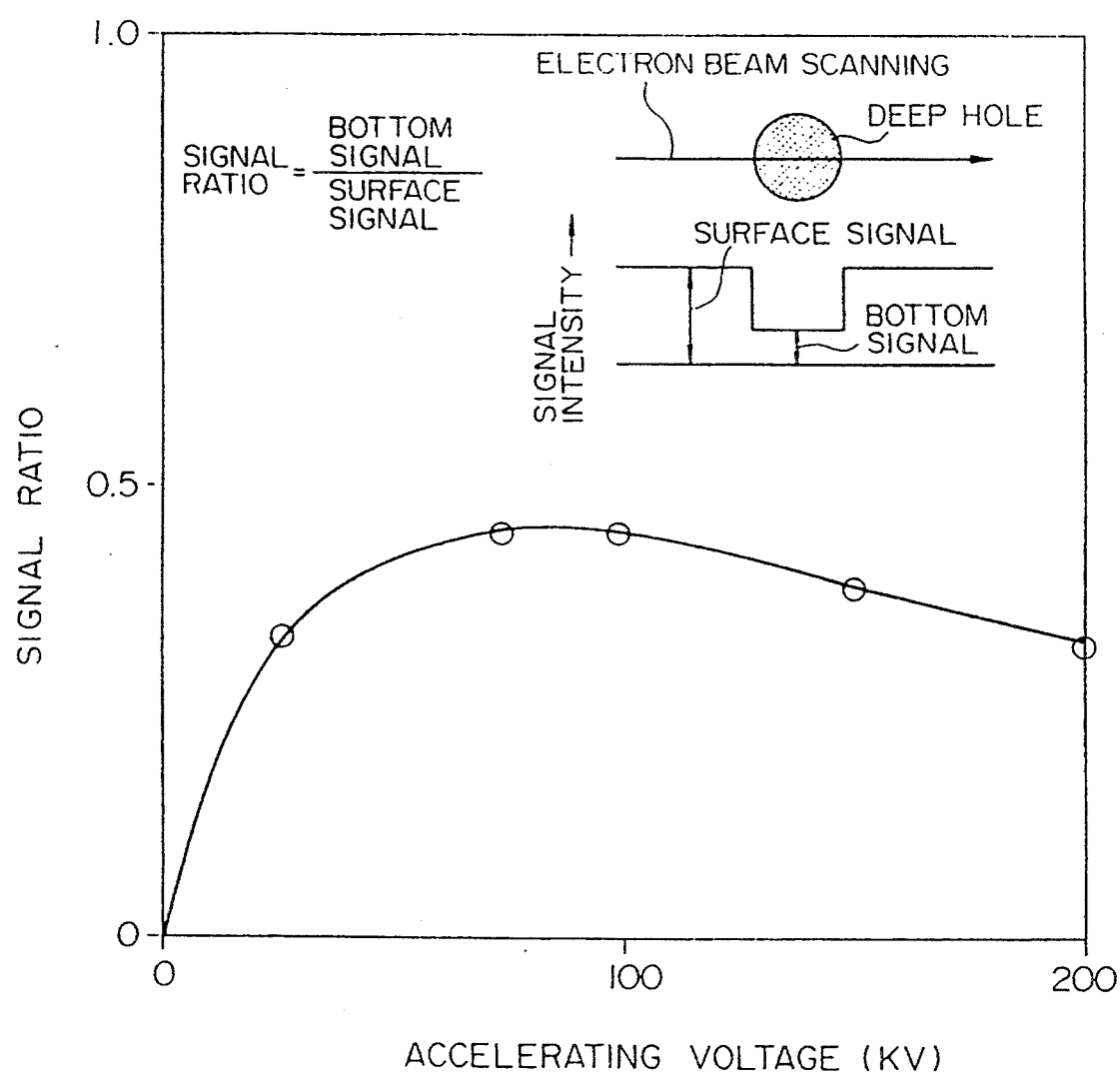
FIG. 12 shows results of actual measurement of increased signals from the bottom of a hole which are obtained by increasing accelerating voltage (energy)

When a hole in $SiO_2$ having an aspect ratio of about 3 and a depth of 1.5 μm was observed, the ratio between signals from the bottom and the surface was measured by changing energy of a primary electron beam to obtain results as shown in FIG. 12. Namely, the ratio between secondary electrons generated by reflection electrons, and secondary electrons generated by the primary electron beam, was measured. It will be appreciated that the ratio is maximized around 100 kV of electron beam energy. When the primary electron beam has low energy, reflection electrons are absorbed by the side wall and therefore no secondary electrons are generated by the reflection electrons. As the energy of the primary electron beam increases, the number of reflection electrons penetrating through the side wall increases and hence the number of secondary electrons thereby generated is increased gradually. However, as the energy is further increased, the primary electron beam intrudes into the specimen more deeply and the number of reflection electrons decreases, leading to a decrease in the number of secondary electrons. This is the reason for existence of the maximum value. Electron beam energy corresponding to the maximum value is related to the depth and material of the hole. The deeper the hole and the denser the material, the higher the maximum value becomes.

Figure 13:
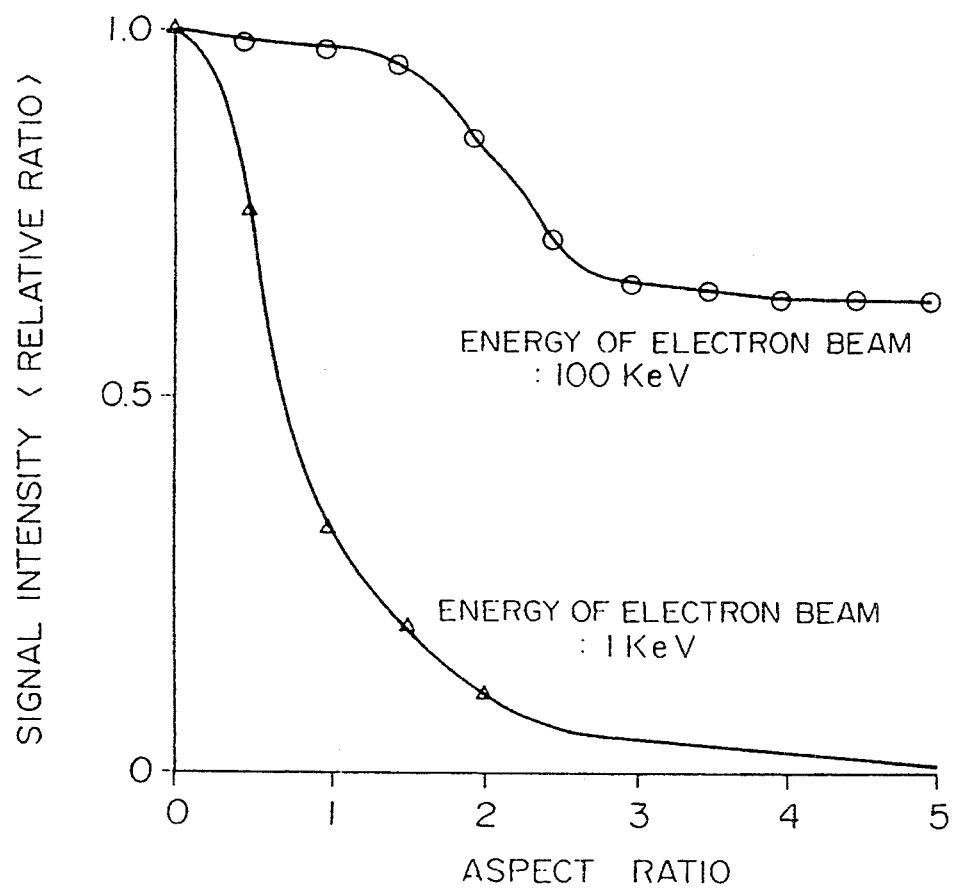
FIG. 13 is a diagram showing the relationship between signal intensity and aspect ratio obtained according to the invention.

FIG. 13 shows the relation between the aspect ratio and the signal ratio obtained when a deep hole was observed by using 100 keV energy. The relation obtained with 1 keV is indicated for reference and it will be appreciated that with 100 keV, even when the aspect ratio exceeds 3, the signal ratio does not decrease and holes of higher aspect ratios can be observed.

In the conventional scanning electron microscope, the energy is less than 50 keV and high energy exceeding 50 keV is not used. This is because there was no concept of observation grounded on the principle described herein. Effectiveness of the high-energy primary electron beam permitting observation of deep holes is disclosed herein for the first time.

Figure 14:
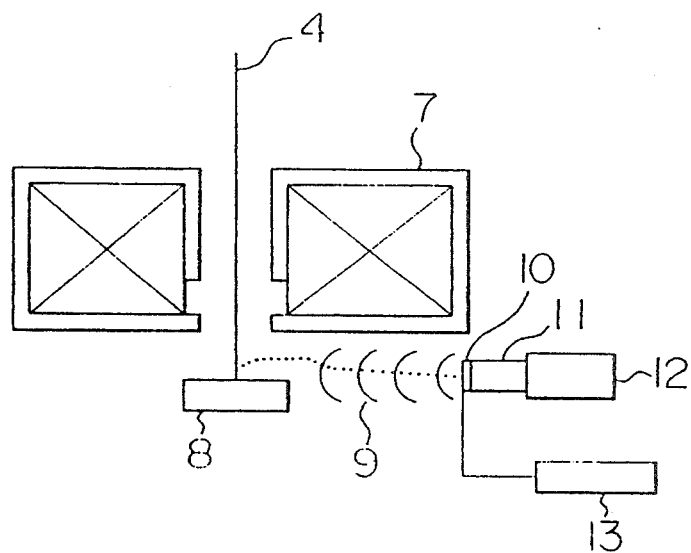
FIG. 14 is a diagram for explaining a method of detecting secondary electrons generated by reflection electrons from the bottom of a hole.

FIG. 14 shows a method of detecting secondary electrons generated by reflection electrons of high energy. This method uses a scintillator 10 and a secondary-electron multiplier 12. Supplied to the scintillator 10 is a high voltage of 10 kV from a high voltage power supply 13. By using an attraction electric field 9 formed by the high voltage, secondary electrons generated by the reflected electrons in the surface of a specimen 8 are detected. A primary electron beam 4 having energy sufficient to generate the secondary electrons from reflection electrons is focused and irradiated on the specimen 8 by means of an objective lens 7. In the Figure, circuits for scanning the primary electron beam and for displaying scanning images are omitted.

Figure 15:
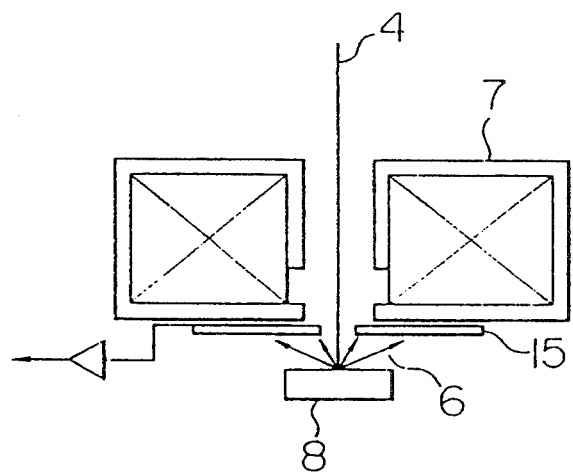
FIG. 15 is a diagram for explaining a method of observing reflection electrons from the bottom of a hole.

FIG. 15 shows an example of detecting not secondary electrons but reflection electrons transmitting through the side wall. A reflection electron detector 15 having a large view angle relative to a specimen 8 is interposed between an objective lens 7 and the specimen 8. The reflection electron detector 15 may be a semiconductor detector having a PN-junction or a Schottky junction or may be based on a method of causing phosphors to luminesce, and of detecting luminescence (an example using a semiconductor is shown in the embodiment). Since the energy of reflection electrons is high, the surface layer of the semiconductor detector is made to be thick (1 to 10 μm), thus preventing degradation of detection efficiency. In the case of phosphors, similar thickening is also employed. The thickness of the phosphor layer measures 10 to 100 μm, depending on energy.

Figure 16:
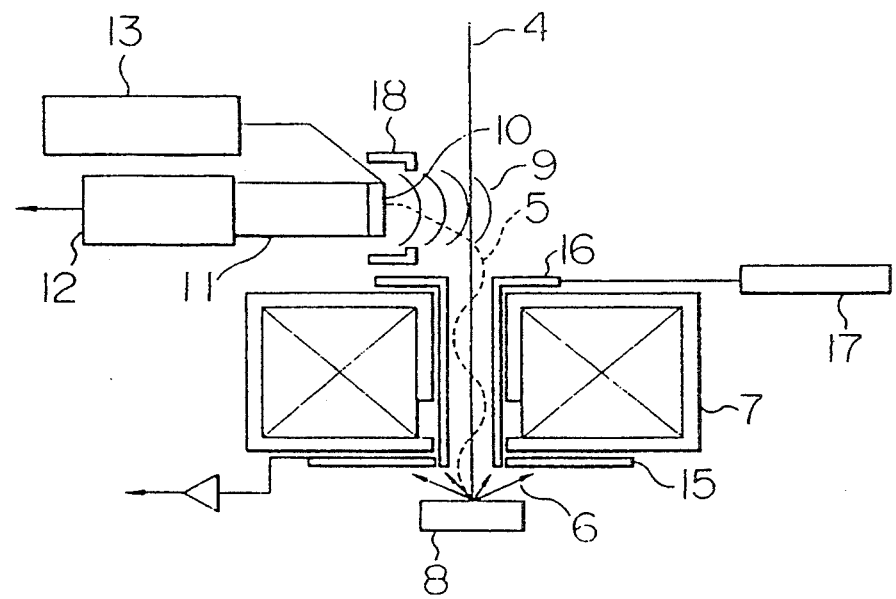
FIG. 16 is a diagram for explaining a method of observing both reflection electrons and secondary electrons simultaneously.

FIG. 16 shows an example where reflection electrons and secondary electrons are both detected. An attraction electrode 16 is provided which passes through the center of an objective lens 7. Secondary electrons 5 generated by the reflection electrons from a specimen 8 are drawn into a magnetic field of the objective lens 7 and pulled upwards by means of the attraction electrode 16. The secondary electron 5 thus pulled upwards are accelerated by an attraction electric field 9 formed by a scintillator 10 so as to impinge on the scintillator 10 and cause it to luminesce.

Luminescent light is guided to a light guide 11 and amplified and converted into an electrical signal by means of a secondary-electron multiplier 12. Reflection electrons generated from the specimen 8 have high energy and therefore they are hardly deflected by an electric field formed by the attraction electrode 16, keeping a substantially straight path and impinging upon a reflection electron detector 15. Through this process, the reflection electrons themselves and the secondary electrons generated from the reflection electrodes can be detected distinctively. Since scanning images formed by the two types of electrons are slightly different from each other, it is possible to select one of the images which has better contrast, or to perform addition/subtraction to improve contrast.

In the foregoing embodiments, secondary electrons and reflection electrons are generated on the side upon which the primary electron beam is incident, but, when the specimen is thin, either secondary electrons generated by transmitted electrons or the transmitted electrons themselves may be detected.

Figure 17:
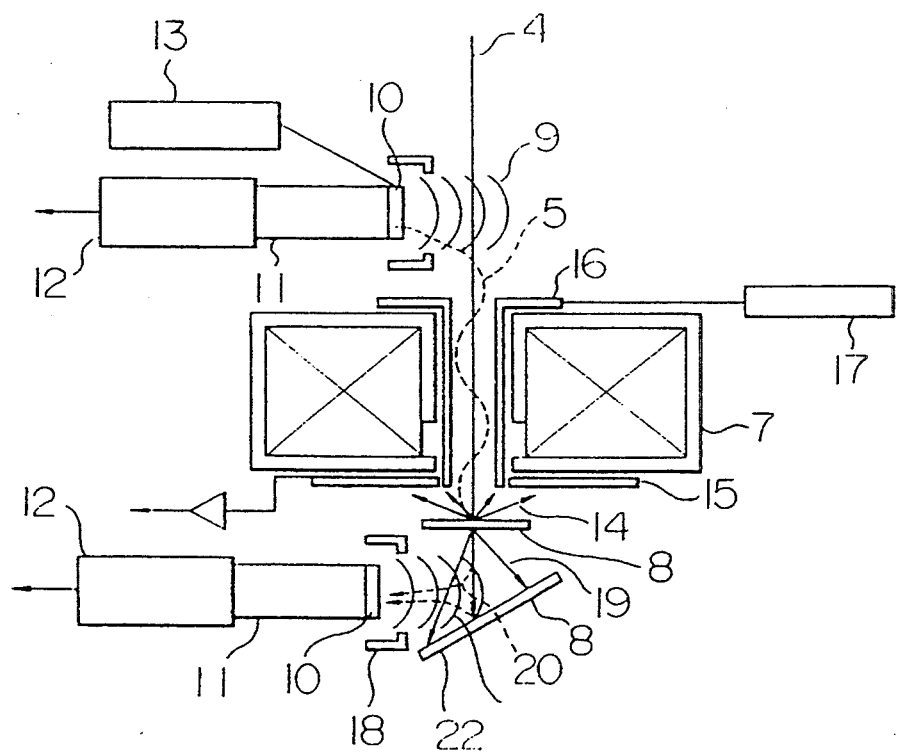
FIG. 17 is a diagram illustrative of detection of electrons transmitting through a specimen.

FIG. 17 shows an embodiment in which secondary electrons generated on the side opposite the primary electron beam and transmitted electrons are detected. The manner of detection on the primary electron beam side is the same as that in the previously-described embodiment. Secondary electrons 20 generated from the undersurface of a specimen 8 by electrons transmitting through the specimen and secondary electrons 21 generated by impingement of transmitted electrons 19 upon a reflection plate 22 are detected by using a scintillator 10, a light guide 11 and a secondary-electron multiplier 12. Electrons of a primary electron beam of 200 keV energy have a range of 200 μm and can transmit through even a Si wafer used in the semiconductor industry. Thus, by detecting transmitted electrons and secondary electrons generated from the undersurface of the specimen, a hole formed in the surface of the specimen 8 can be observed.

Figure 18:
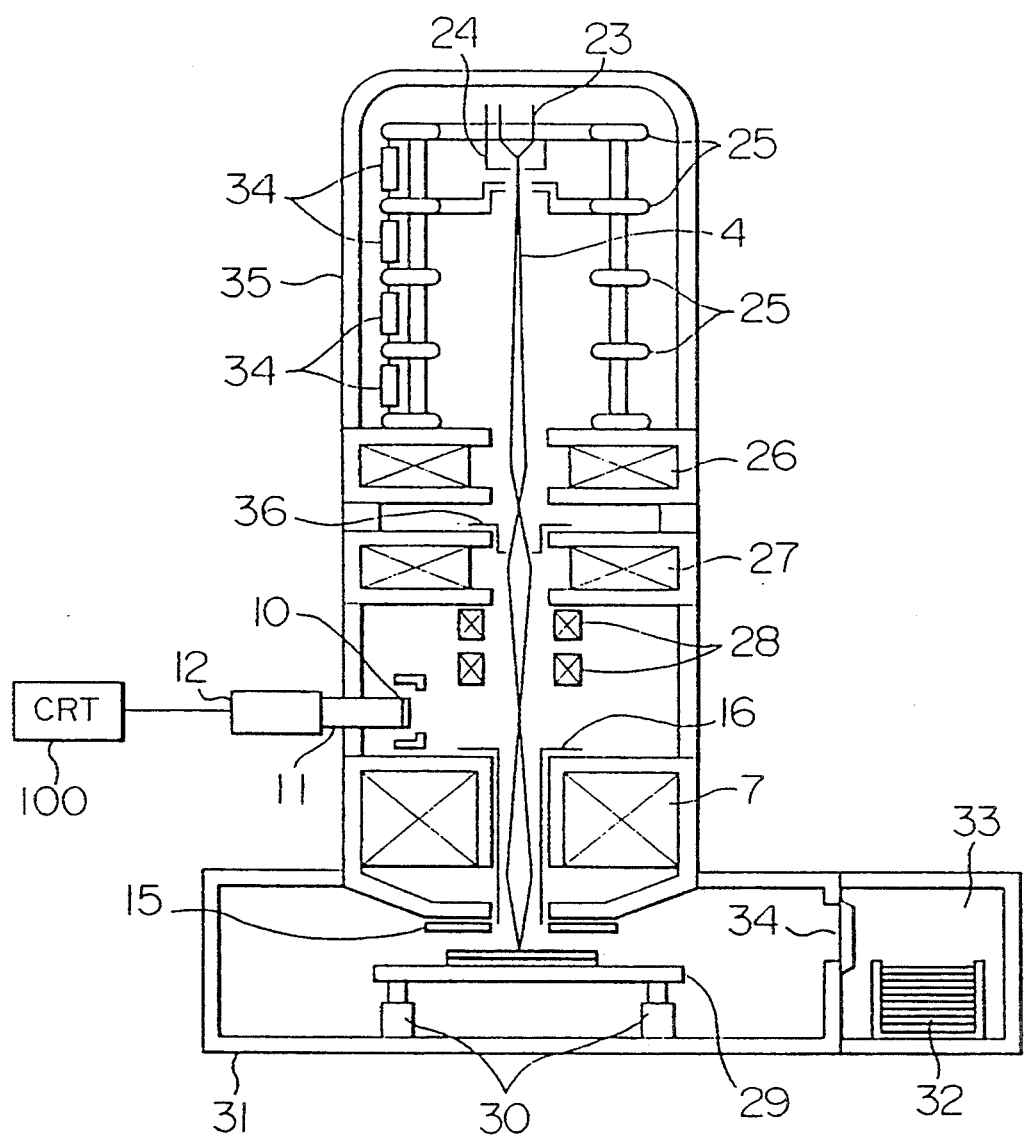
FIG. 18 is a diagram for explaining an embodiment of the invention which can permit observation of an object in wafer condition in accordance with the principle of the observation and detection method according to the invention.

FIG. 18 shows a scanning electron microscope using the principle of observation and the detection method described previously. The source of electrons can be a single crystal of $LaB_6$ heated to emit electrons. Emitted electrons are controlled by means of a Whenelt 24. The emitted electrons are accelerated by accelerating electrodes 25. The accelerating voltage (energy) in the present embodiment has a maximum value of 200 keV.

An accelerating electrode 25 of the uppermost stage is applied with the accelerating voltage, and divisional voltages due to dividing resistors 34 are applied to individual accelerating electrodes 25. Here, the cable and power supply for application of the accelerating voltage are omitted.

An accelerating unit including the accelerating electrodes 25 is shielded with a high voltage shield 35. An accelerated primary electron beam 4 is reduced in size by means of a first condenser lens 26, a second condenser lens 27 and an objective lens 7. When an objective lens having a focal distance of 30 mm is used, a resolution value of 3 nm can be obtained at 200 keV. The aperture of the electron beam is determined by an aperture 36 placed on the second condenser lens 27.

Scanning of the electron beam is carried out by a scanning coil 28. The scanning coil is constructed of two stages of coils so that the electron beam subject to scanning may pass through the center of the objective lens 7. Reflection electrons reflected at a specimen are detected by a reflection electron detector 15 and secondary electrons generated by the reflected electrons are led upwardly of the objective lens 7 and detected by a detector comprised of a scintillator 10, a light guide 11 and a secondary-electron multiplier 12.

The specimen is a wafer of 4 inches or more carried on an XY fine movement stage 29. The specimen can be inclined by ±15 degrees in desired directions by means of a specimen inclination fine movement section 30. The specimen inclination fine movement section 30 has three posts, and the length of each post can be controlled by a computer. A wafer to be observed is contained in a dedicated cassette 32 and the cassette is stored in a preparatory chamber 33. When conducting an observation, a valve 34 is opened and the specimen is brought onto the XY fine movement stage 29 by using an exchange mechanism (not shown). When the same portion of the specimen is observed by changing the inclination angle, the height can be measured (stereo-measurement).

In highly integrated semiconductor devices, the etching process for working a deep hole of high aspect ratio is important as has already been described. Etching for working a deep hole of high aspect ratio is very difficult and for determination of etching conditions, observation of the bottom of the deep hole and confirmation of the process of etching are needed.

Figure 19:
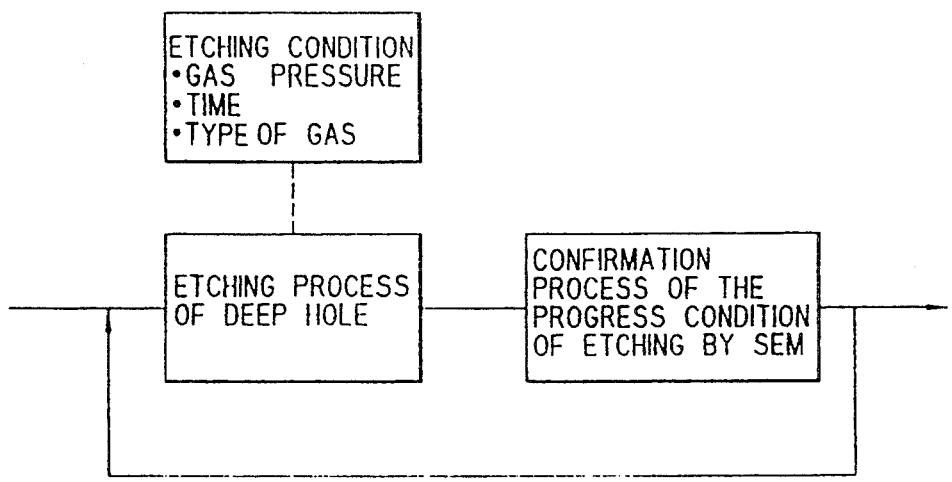
FIG. 19 is a diagram showing a flow for determining etching conditions by using the scanning electron microscope.

FIG. 19 shows a flow of the confirmation wherein in accordance with the results of confirmation, feedback for urging, for example, re-etching is undertaken to ensure process integrity. The thus-determined etching conditions are relayed to the succeeding process. By repeating the confirmation at a fixed period, the process can be made to be stabler.

The scanning electron microscope is very effective for the confirmation of etching and can contribute to improvement in yield of production of highly-integrated devices. Especially, the high-energy scanning electron microscope utilizing secondary electrons generated by reflected/transmitted electrons described so far is effective.

Figure 20:
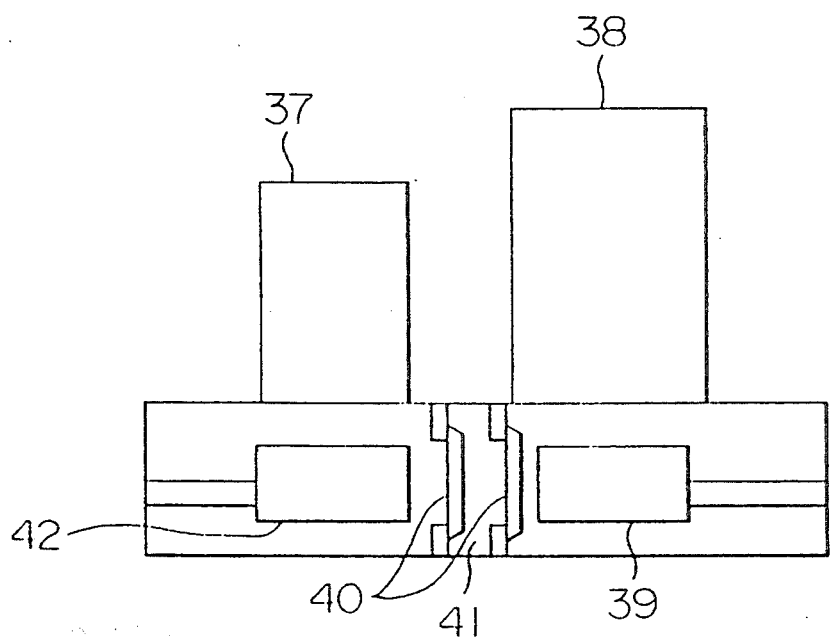
FIG. 20 is a conceptual diagram of an arrangement in which a specimen chamber is provided in common for microwave etching and for a scanning electron microscope to facilitate determination of etching conditions.

FIG. 20 shows an arrangement contrived to simplify the aforementioned confirmation process, in which a specimen chamber is provided in common for a microwave etching apparatus 38 and a high-energy scanning electron microscope 37, and etching and inspection can be carried out alternately by merely moving a specimen from an etching apparatus specimen stage 39 to a scanning electron microscope XY fine movement stage 42. The degree of vacuum in the microwave etching apparatus is $10^{-4}$ Torr which is comparable to that in the scanning electron microscope but, because of the use of inert gas, an intermediate chamber 41 is provided in the present embodiment in order that the inert gas can be prevented from flowing into the scanning electron microscope by switching valves 40 alternately for intermediate chamber 41. In the Figure, the evacuation system is omitted.

As described above, in accordance with the principle of observation according to the invention, deep holes of which observation was impossible in the past can be observed. This implies that inspection can be carried out in-line in the process of semiconductor device production, resulting in very beneficial effects.

Figure 21:
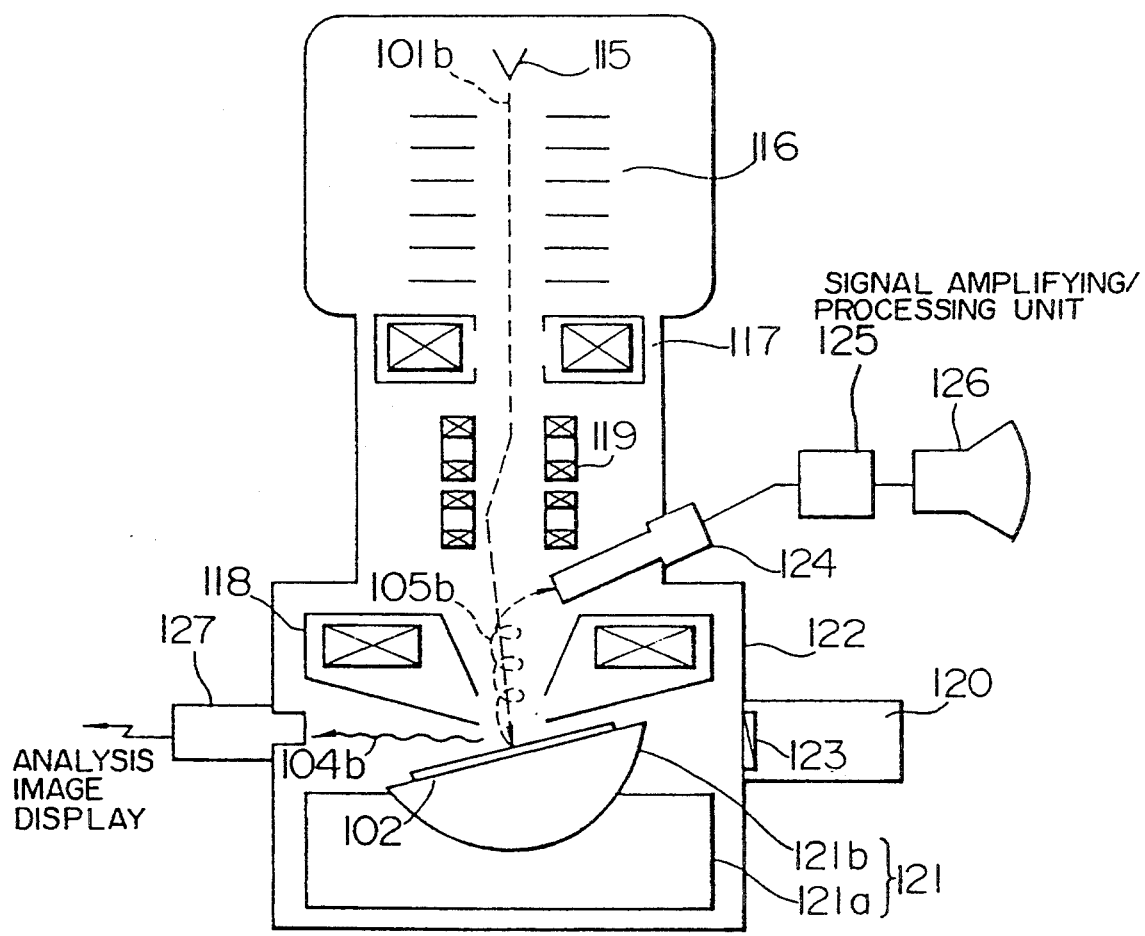
FIG. 21 is a sectional view showing the construction of a scanning electron microscope according to another embodiment of the invention.

Another embodiment will be described with reference to FIG. 21.

Firstly, a specimen 102 is moved from a loader/unloader chamber 120 onto a specimen stage 121 inside a specimen chamber 122 by a load/unload mechanism, not shown, and loaded on the specimen stage. The loader/unloader chamber 120 is in the form of a load lock mechanism, wherein the loader/unloader chamber is separated from the specimen chamber 122 by a vacuum valve 123 so that the specimen 121 may be loaded on the specimen stage 121 without breaking vacuum. An electron beam 101b is then emitted from an electron gun 115 and it is accelerated to an energy level of several tens of keV by means of an accelerating tube 116, focused to be thinned by means of a focusing lens 117 and an objective lens 118, and irradiated to the specimen 102. When subjected to XY deflection by means of a deflector 119, the electron beam is scanned on the specimen 102.

A mechanism for moving the specimen and the specimen stage 121 is provided, and may be an external view inspection apparatus (trade name: S-7000) manufactured and sold by Hitachi, Ltd. The electron gun 115, accelerating tube 116 and focusing lens 117 are structurally the same as those of a transmitting electron microscope (trade name: H-800) also manufactured and sold by Hitachi, Ltd.

Secondary electrons 105b are discharged or emitted from a portion of the specimen irradiated with the scanning electron beam 101b, along with an electromagnetic wave 104b representative of X-rays and photons.

Secondary electrons 105b are drawn upwards in the axial direction of the objective lens 118 while whirling under the influence of a magnetic field of the objective lens 118, and are detected by a secondary electron detector 124 constructed of a scintillator and a photomultiplier tube so as to be converted into an electrical signal. The electrical signal is amplified and then modulated in brightness by means of a signal amplifying/processing unit 125 to produce a specimen image which is displayed on a display 126. Similarly, electromagnetic wave 104b, such as X-rays or photons, discharged from the specimen 102 is detected by a detector 127 and used for analysis or image display.

The specimen stage 121 includes an X/Y moving mechanism 121a and a rotating/inclining mechanism 121b to permit selection of a desired observation site or location and a desired observation direction.

Figure 22:
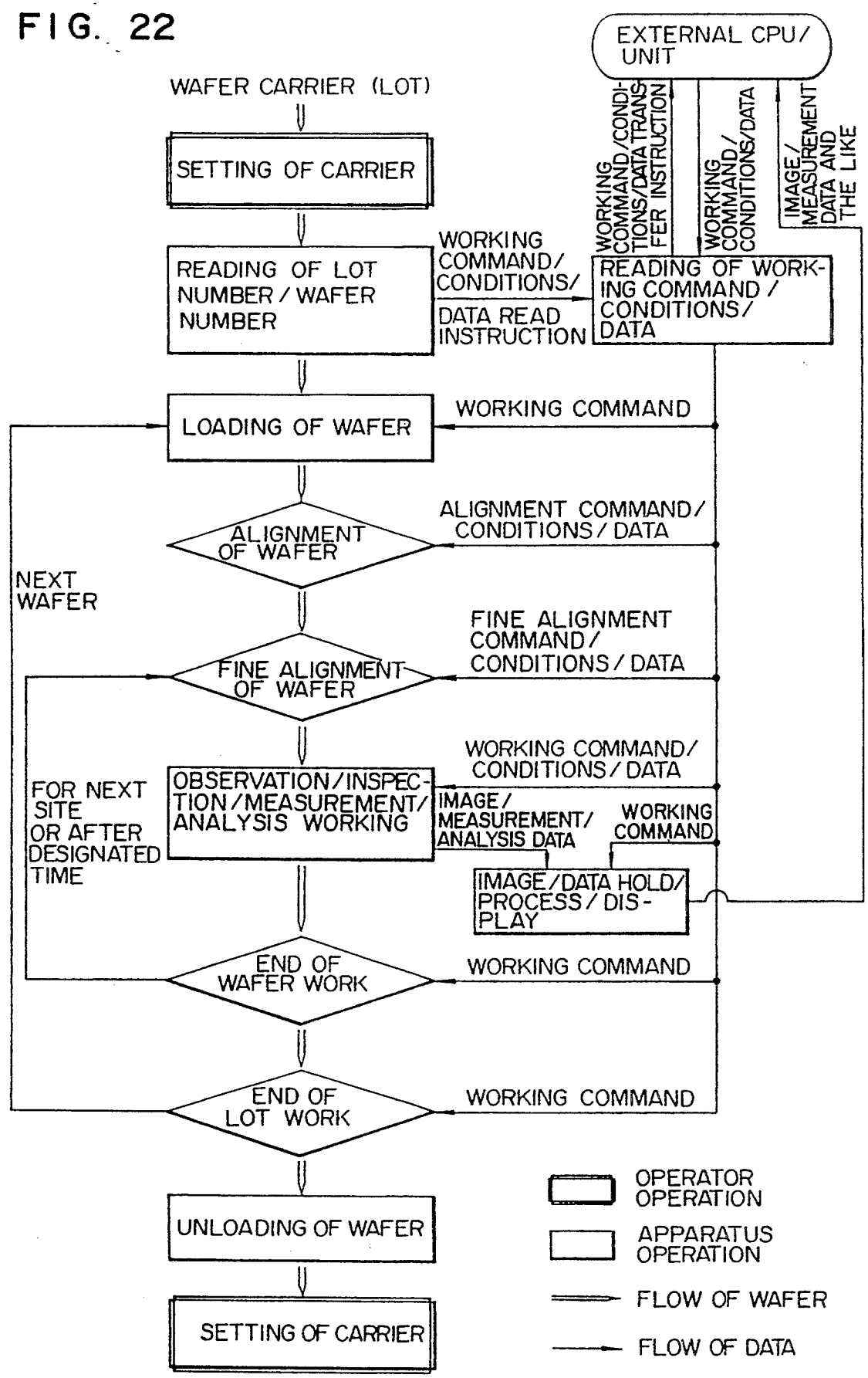
FIG. 22 is a flow chart showing the operation of a display apparatus according to an embodiment of the invention.

FIG. 22 shows an example of a flow chart of scanning and processing in the case where semiconductor wafer specimens 102 are processed in lot units.

Wafer specimens 102 are kept by lot in a wafer carrier. When the wafer carrier is set in the loader/unloader chamber 120, a lot number described on the wafer carrier is read by means of an optical or magnetic reader and the apparatus is started. Subsequently, working command, working conditions and working data corresponding to the lot number are read. The succeeding process is automatically carried out on the basis of the working command, working conditions and working data.

The working command stipulates the processing operation that determines which one of the wafers is to be subjected to which operation at which site. The working conditions are concerned with electron beam irradiation, image forming process and measuring process, and prescribe apparatus parameters necessary for performing the various operations. The working data correspond to data other than the apparatus parameters needed for work prosecution, for example, position coordinate data of defects transferred from an external tester or a defect inspection apparatus.

In the processing, a sheet of a designated wafer is first loaded on the specimen stage 121. Subsequently, wafer aligning work is carried out according to the alignment method adopted in an electron beam exposure apparatus. Rough alignment of the wafer may be conducted before loading the wafer on the specimen stage 121. For example, a method may be employed wherein a contour of the wafer is detected optically to determine the center of the wafer. For fine alignment of the wafer, a method may be employed wherein an electron beam 101b is scanned on an alignment mark formed on the wafer to produce reflection electrons, and an alignment mark position is determined from a signal waveform representative of the thus-produced reflection electrons. Alternatively, an alignment mark position may be determined by bringing a scanning image of an alignment mark into coincidence with a previously stored reference image.

After completion of the alignment, another work of interest, such as observation, inspection and measurement or analysis is carried out. These operations may be conducted individually or simultaneously; for example, observation and analysis may be conducted in combination. Work results as represented by image data, inspection data, measurement data and analysis data of the specimen are then subjected to predetermined data processing and thereafter kept and displayed in accordance with a predetermined procedure, or are transferred to an external host computer, analysis apparatus or wafer process apparatus.

Various operations can be practiced in such a way that a plurality of desired sites within a wafer are worked, or the same site on o in a wafer is worked repetitively at desired time intervals.

Further, the particular operations can be changed for individual wafers or for individual working sites on or in a wafer. The type of operation can be inputted through a control computer of the present apparatus or from a host computer on line.

The above operations are applied to all of the designated wafers.

Specific examples of work of interest or the present work will now be described.

Figure 23:
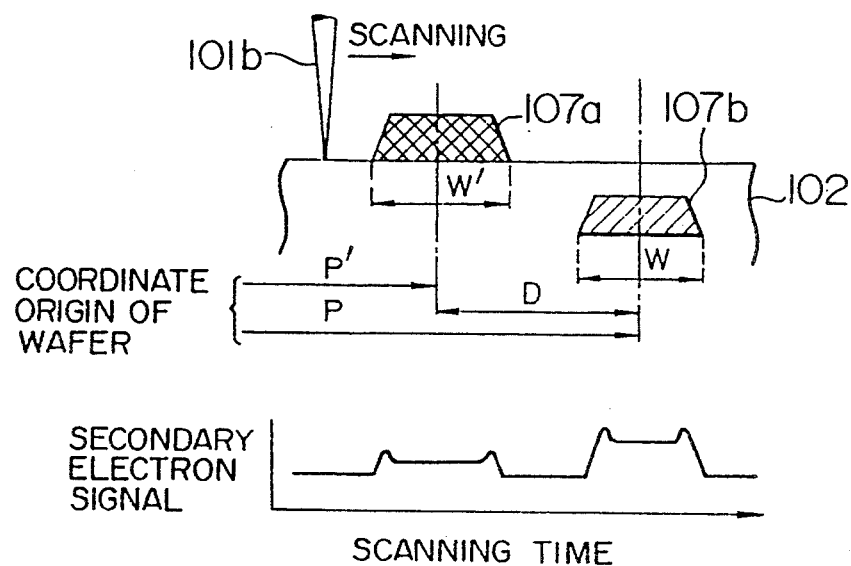
FIG. 23 is a conceptual diagram showing an example of a length-measuring method according to an embodiment of the invention.

One of the inspection operations is a length-measuring operation. An example of this working is shown in FIG. 23.

Figure 1:
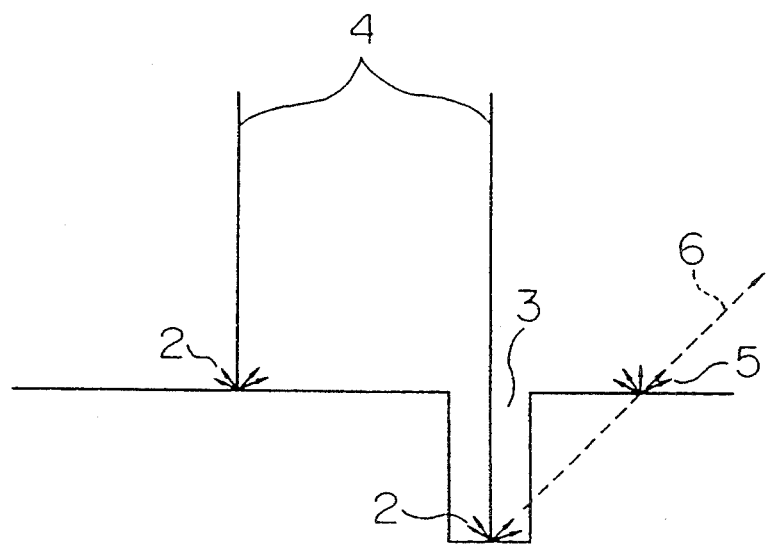
FIG. 1 is a diagram for explaining the principle of observation according to the invention.
Figure 2:
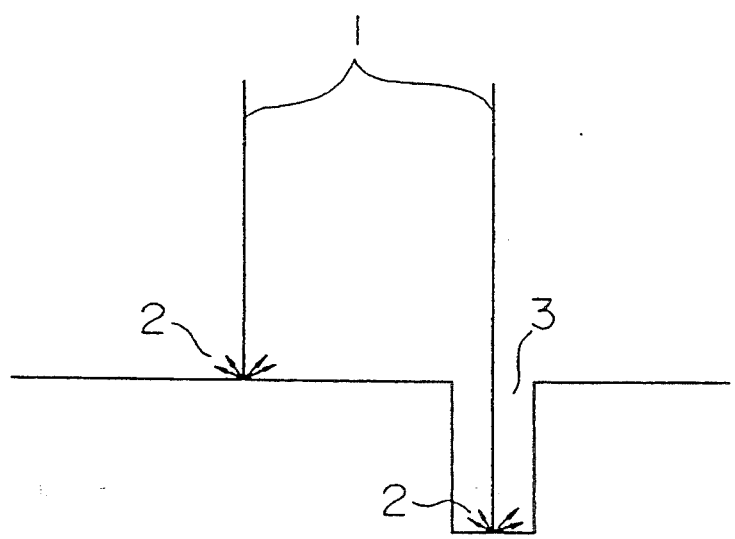
FIG. 2 is a diagram for explaining a conventional observation method.
Figure 3:
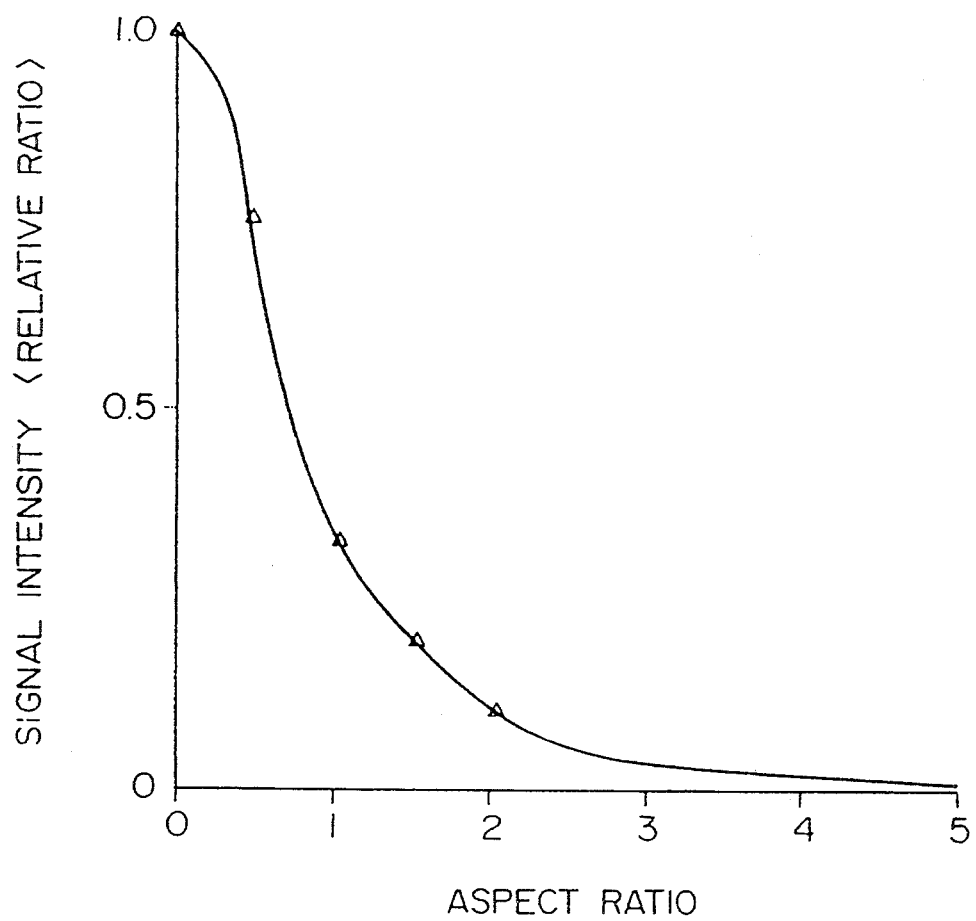
FIG. 3 is a diagram showing the relationship between signal intensity from a hole and aspect ratio obtained in accordance with the conventional method.
Figure 4:
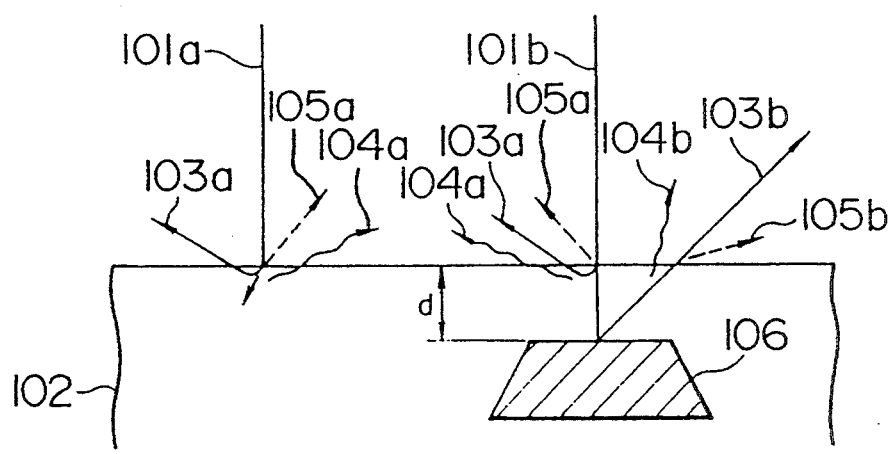
FIG. 4 is a conceptual diagram diagrammatically showing the principle of a scanned specimen image displaying technique of the invention.
Figure 5:
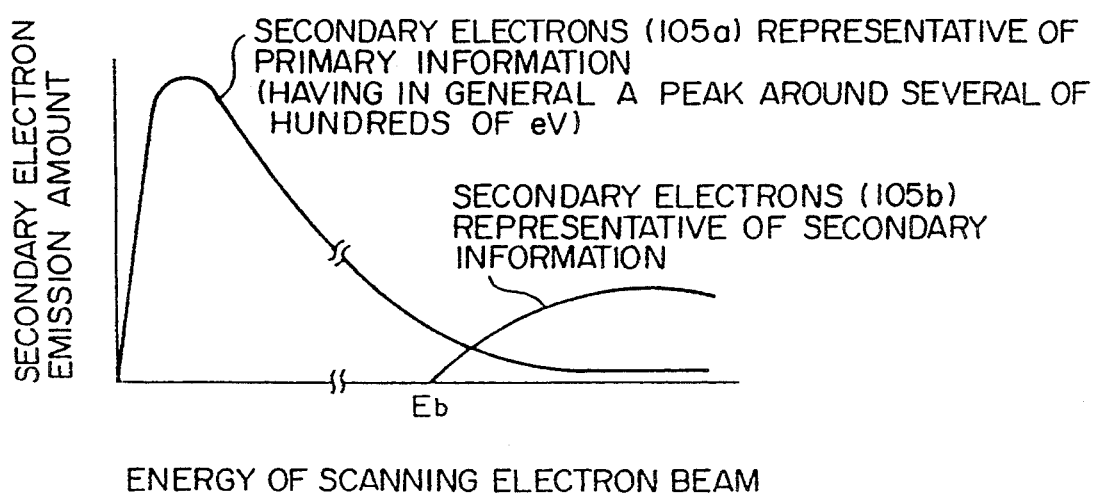
FIG. 5 is a graph showing a model of the relationship between the scanning electron beam energy and the secondary electron emission amount.
Figure 6:
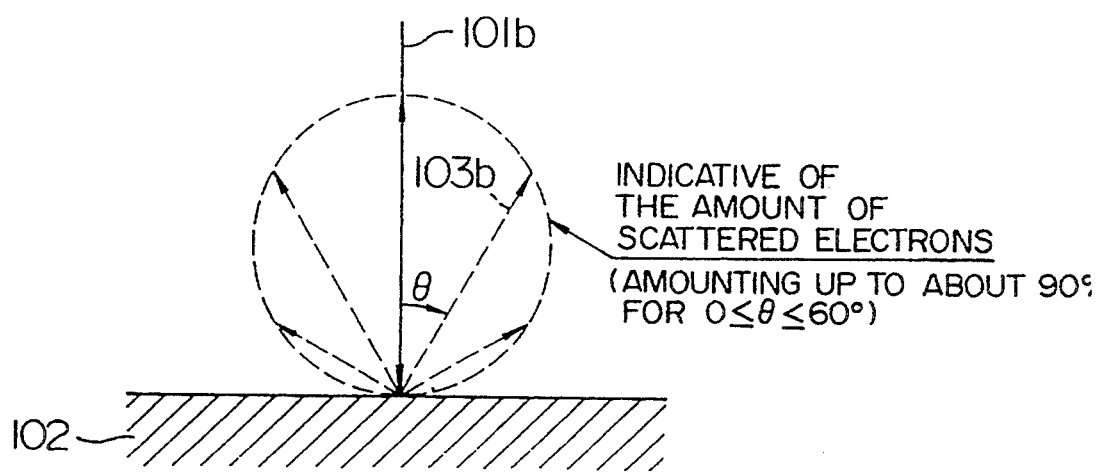
FIG. 6 is a conceptual diagram showing an example of distribution of the scattered electron amount.
Figure 7:
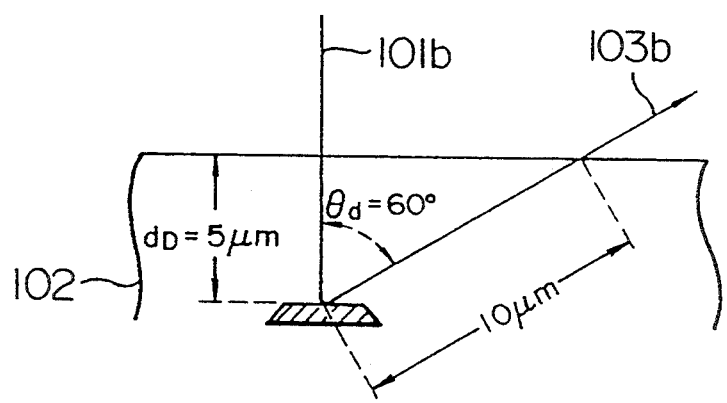
FIG. 7 is a conceptual diagram useful to determine the electron beam energy necessary for observation of a semiconductor device.
Figure 8:
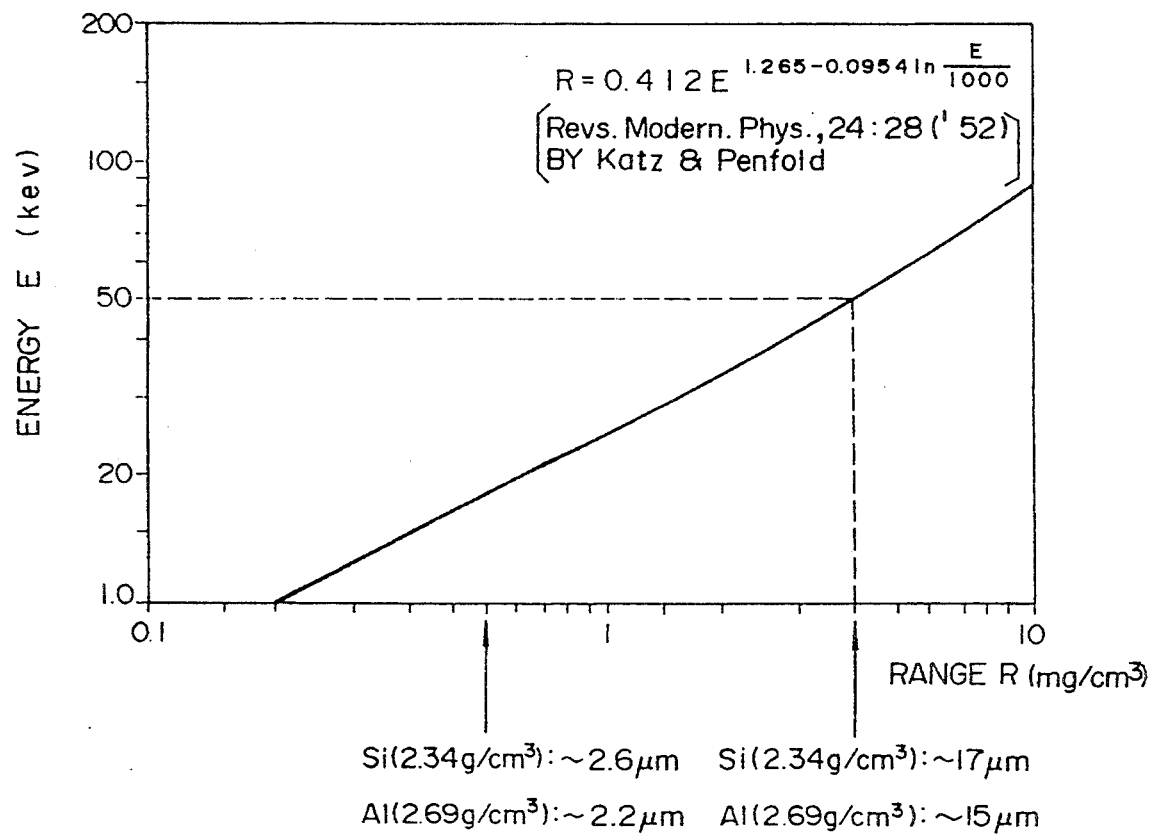
FIG. 8 is a graph useful to determine the electron beam energy necessary for observation of the semiconductor device.
Figure 9:
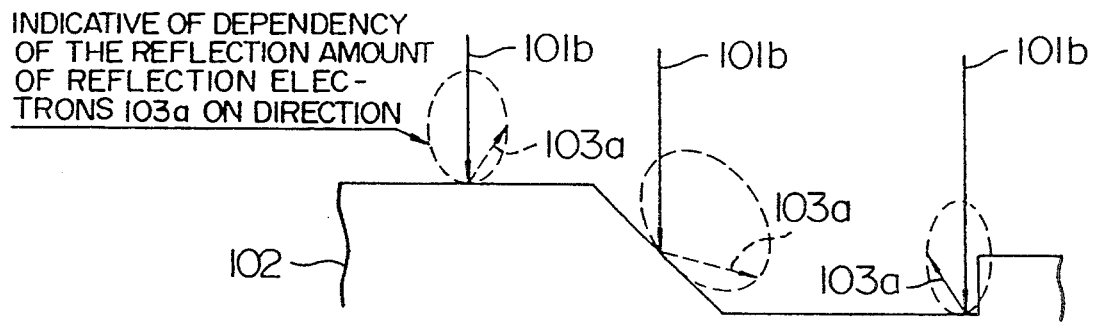
FIG. 9 is a conceptual diagram useful to explain an example of the change of contrast with conditions of the specimen surface.
Figure 10:
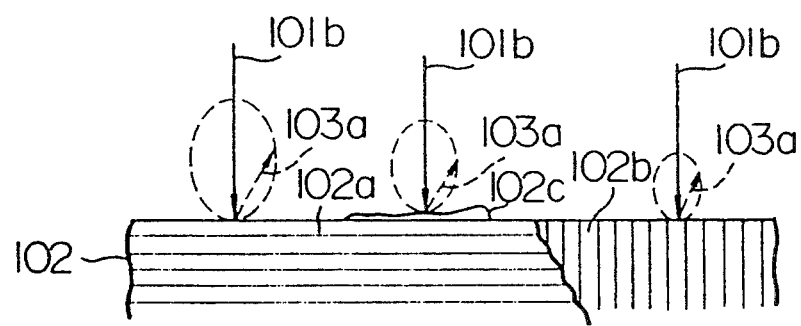
FIG. 10 is a conceptual diagram useful to explain another example of the change of contrast with conditions of the specimen surface.
Figure 11:
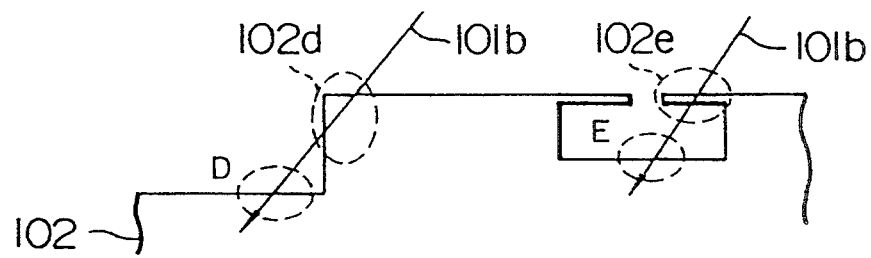
FIG. 11 is a conceptual diagram useful to explain still another example of the change of contrast with conditions of the specimen surface.

A pattern 107a formed on the surface of a specimen 102 and a pattern 107b formed inside the specimen are scanned with an electron beam 101b, and pattern dimensions W and W', interpattern distance D and pattern position coordinates P and P' are determined from secondary electron signal waveforms. Length measurement is carried out in a specific manner which accords with a method generally employed in a length-measuring SEM. The electron beam 101b has an energy level of 50 keV or more. Therefore, as will be seen from the relation depicted in FIG. 5, a signal corresponding to a first pattern 107b is larger than a signal corresponding to a second pattern 107a.

Figure 24:
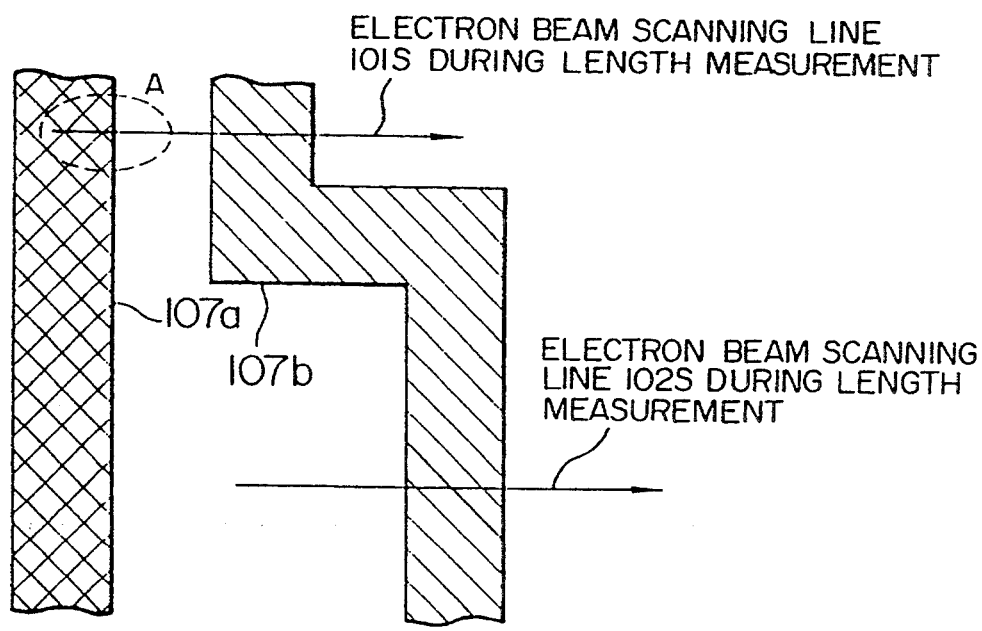
FIG. 24 is a plan view of a specimen.

In this case, if, as shown in FIG. 24, the pattern 107a is located so near the pattern 107b to be measured that a scanning line 101s of the electron beam encounters the pattern 107a as shown at A, errors in measurement possibly occur. It is desirable that at a length measuring portion the patterns 107a and 107b be spaced apart from each other by a width of a scanning line or more as shown at scanning line 102s.

Figure 25:
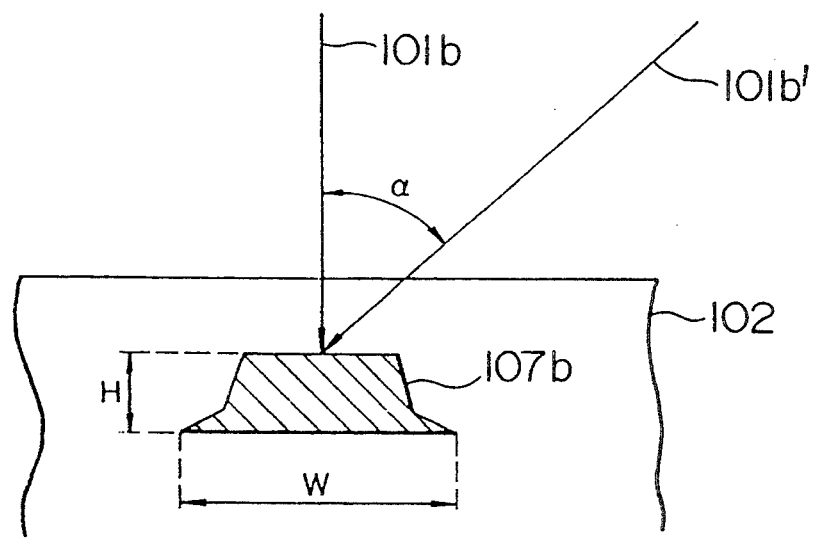
FIG. 25 is a conceptual diagram showing a method of determining a three-dimensional configuration of a specimen according to an embodiment of the invention.
Figure 26:
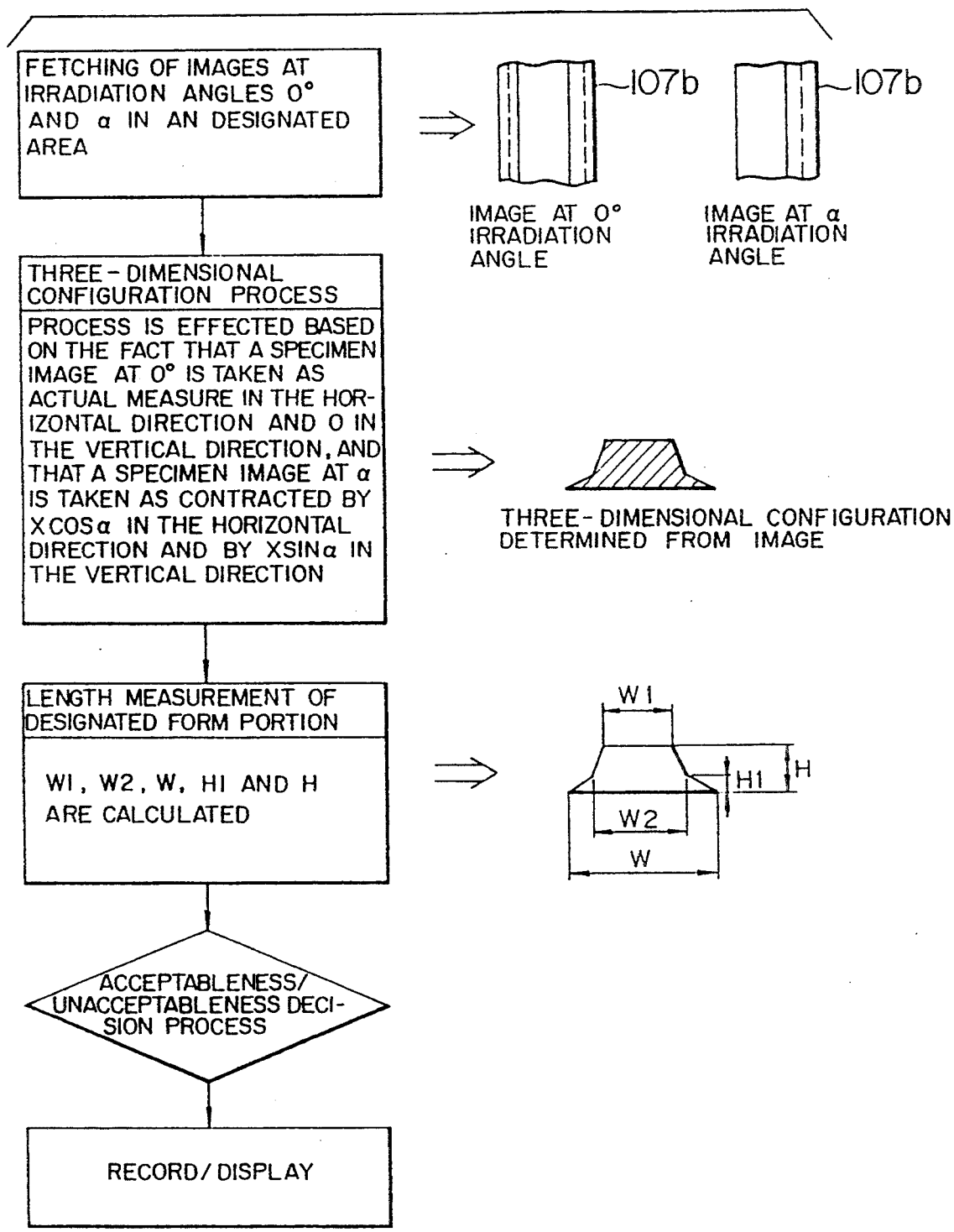
FIG. 26 is a flow chart for determination of the three-dimensional configuration of a specimen according to an embodiment of the invention.

As exemplified in FIGS. 25 and 26, the same view field can be observed at different angles or in different directions to obtain two or more images of the same field of view, thus determining a three-dimensional configuration, and display of the three-dimensional configuration or measurement of three-dimensional size can be effected on the basis of the three-dimensional configuration. For example, images of the same view field are fetched at an irradiation angle of 0° subtended by the electron beam 101b and specimen 102 (observed from directly above) and at an irradiation angle of 0° subtended by the electron beam and specimen (observed obliquely from above), and the two images are examined with a distance difference between two points to be measured to calculate a three-dimensional configuration. Specifically, in a specimen image at an irradiation angle of 0°, a distance between two points in the horizontal direction is taken as an actual measure but a distance in the vertical direction is taken as 0 (zero).

On the other hand, utilized in connection with a specimen image at an irradiation angle of $\alpha$ is the fact that the actual size is taken as contracted by $x \cos \alpha$ in the horizontal direction and $x \sin \alpha$ in the vertical direction.

The irradiation angle can be changed by changing the incident angle of electron beam 101b to the specimen 102 by means of a deflector or by changing the inclination angle of specimen stage 121. The change of irradiation direction and angle is not limited to the two-step change. When a specimen is inclined in a number of directions in which the specimen is desired to be observed in configuration and to be measured in length, and a number of specimen images are fetched, fidelity and accuracy of a three-dimensional configuration to be calculated can be improved. By narrowing the width of scanning of the electron beam, a substantial sectional view can be formed accurately.

A plurality of images can be displayed simultaneously by, for example, displaying a specimen image and a three-dimensional image in combination. The simultaneous display can be provided on the same display or on different displays.

This function can be applied, in particular, to a pattern size measuring apparatus, a pattern position coordinate measuring apparatus, an apparatus for accurate measurement of pattern superimposition and an apparatus for measurement of pattern drawing distortion or transfer distortion.

Especially, the conventional applied electron beam apparatus was unable to measure a pattern positioned inside a specimen and failed to measure the accuracy of pattern superimposition, but the present embodiment makes both possible.

As a second example, measurement of particles and domains, bubbles and foreign materials is enumerated.

Figure 27A:
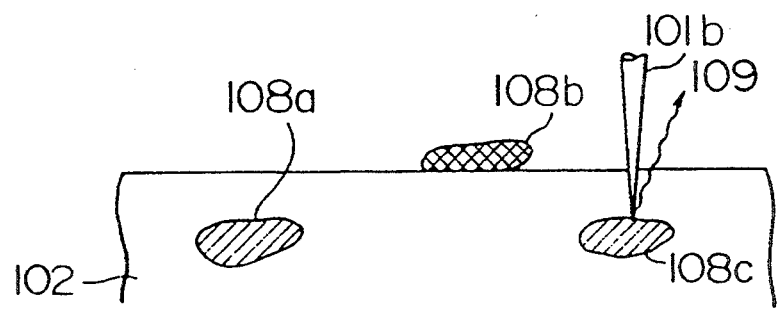
FIG. 27A is a conceptual diagram showing an embodiment of observation of particles in a specimen.
Figure 28:
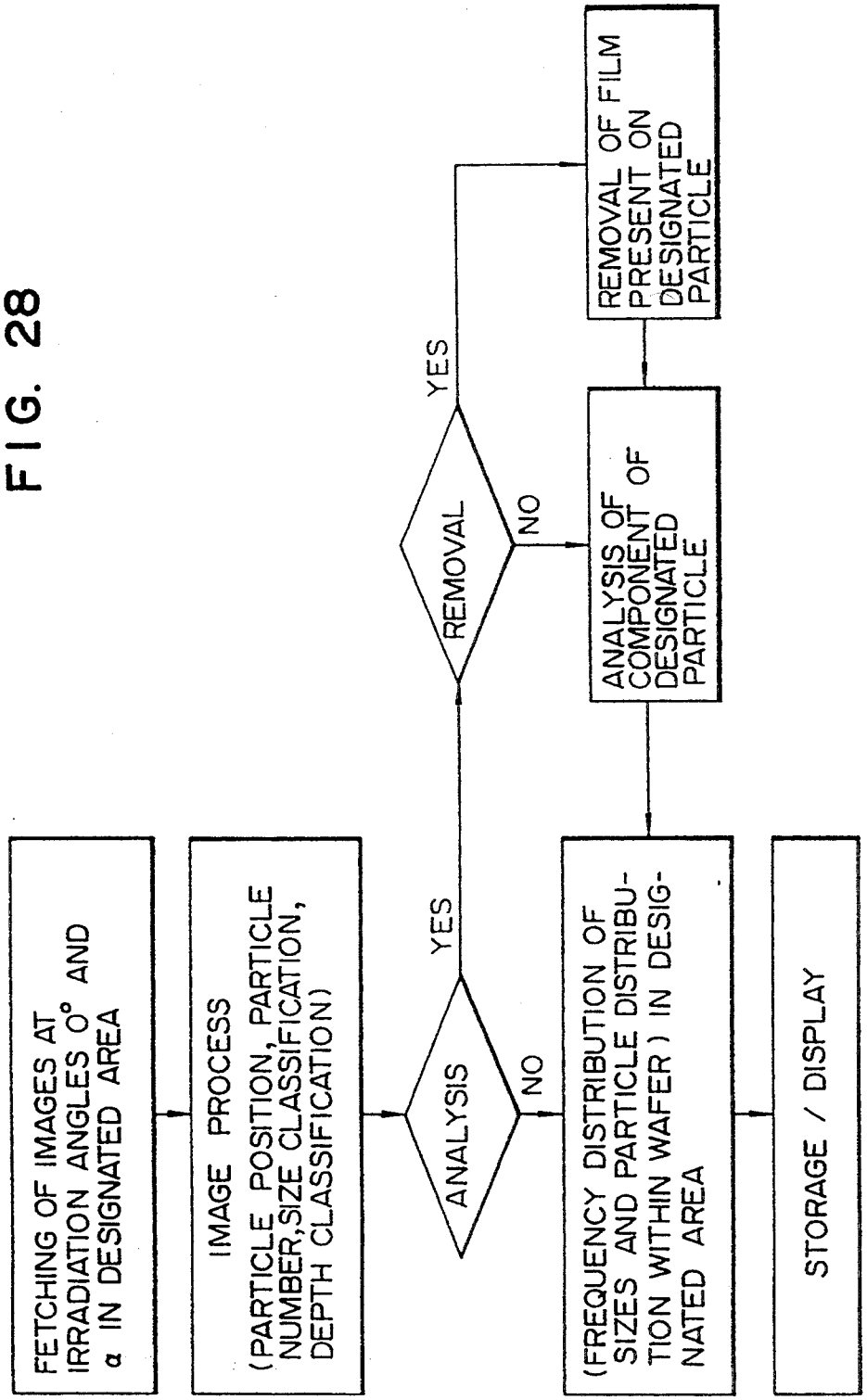
FIG. 28 is a flow chart for observation of particles.

FIG. 27A shows an example of measurement of particles according to the method illustrated in FIG. 28. A designated area of specimen 102 is scanned with a scanning electron beam 101b to fetch specimen images. The specimen images are analyzed and the number of particles are counted to determine data indicative of size distribution and distribution of particles within a wafer. In this case, the number of counted particles can be analyzed in a manner which accords with the method generally employed in an image analyzer.

A measuring operation can be carried out along with analysis of components of particles. Used for the component analysis is a method wherein position coordinate data of a particle 108c desired to be subjected to component analysis is determined from a specimen image, positions of the electron beam and of the particle to be analyzed are determined on the basis of the position coordinate data, the electron beam 101b is irradiated onto the target particle 108c, and characteristic X-rays 109 emitted from the particle 108c are detected to determine a component. A semiconductor detector is used for X-ray detection and a technique is employed wherein the kind and quantity of an element are determined from the peak value and number of current pulses generated by incident X-rays.

Figure 27B:
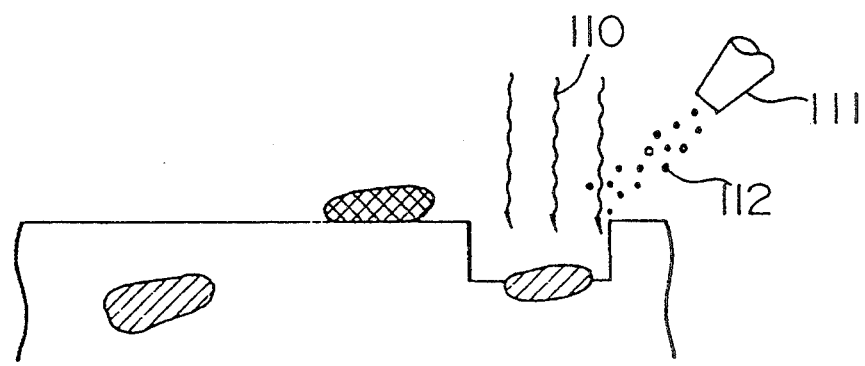
FIG. 27B is a conceptual diagram showing a method of removing a particle on a specimen by etching.

In this procedure, for the sake of increasing sensitivity and accuracy of the component determination, a covering on the particle 108c may be removed. Selective removal of the covering on the particle can be achieved by, for example, laser-assist etching as shown in FIGS. 27B and 28, in which an etching gas 112 is sprayed from a gas nozzle 111 while a finely focused laser beam 110 is irradiated to a portion desired to be etched away. The etching gas is a gas having selectivity for etching only the covering without impairing the particle.

When the target consists of various kinds of specimens, a plurality of gas nozzles are adopted and a proper kind of gas is selectively used.

In order to optimize the etching conditions, the horizontal position and vertical position of the gas nozzle are designed to be adjustably movable and the direction of gas spraying is made to be adjustable.

Obviously, for the component analysis, such information as an Auger electron beam or cathode luminescence may be detected in place of X-rays. In addition to an electron beam, a laser beam or an ion beam may be used as an exciting beam for use in the analysis.

As for the etching method, other chemical etching methods may be used. For example, an ion beam-assist etching and a physical etching method such as ion beam sputtering may also be employed. Generally, however, because of the necessity for securing high selectivity of etching between the covering and the particle, the chemical etching method is suitable.

Even in the particle measurement, by fetching a plurality of specimen images in different irradiation directions and at different irradiation angles and subjecting the fetched images to a three-dimensional configuration processing, information in the direction of depth as to a three-dimensional configuration of a particle or as to what kind of particle is distributed at which depth position can be obtained.

Figure 29A:
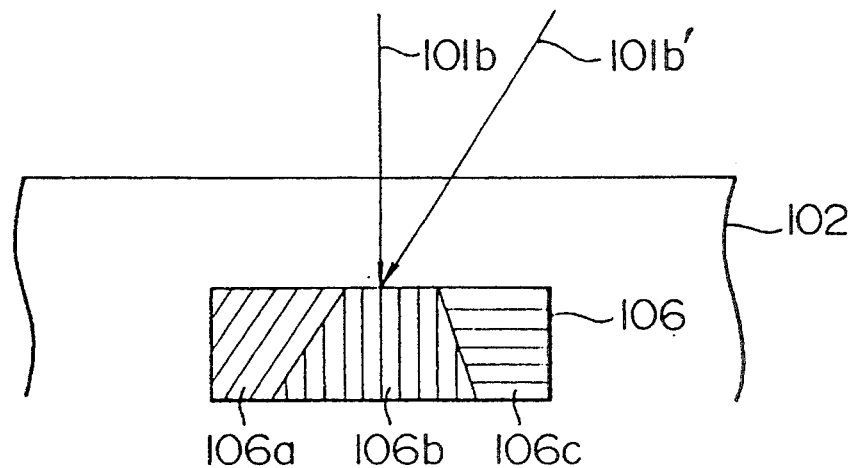
FIGS. 29A–29C are conceptual diagrams showing an embodiment of a method for determining a crystal direction of a crystal grain in a specimen.
Figure 29B:
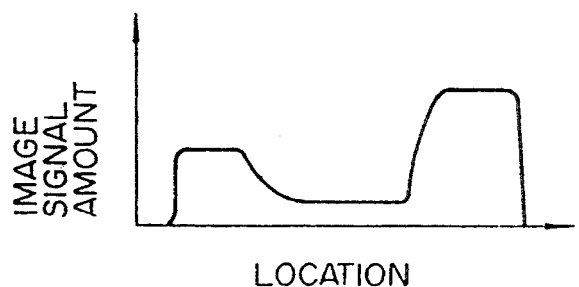
Figure 29C:
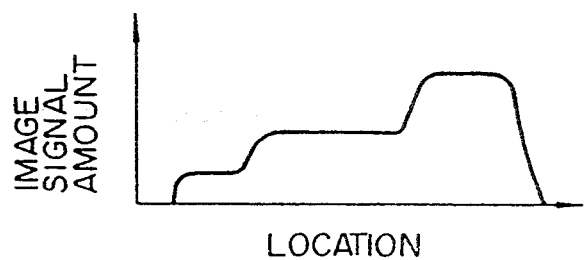

When a specimen is observed by changing the irradiation direction and angle, knowledge of the direction of a crystalline structure can also be obtained. FIGS. 29A–29C show an example to this effect.

Illustrated in the FIG. 29A is an instance where a specimen 102 has a polycrystalline structure 106 (internal structure) and the crystal direction is oblique in a crystal grain 106a, vertical in a crystal grain 106b and horizontal in a crystal grain 106c. When the specimen is observed with a scanning electron beam 101b from directly above as shown in FIG. 29B, the amount of scattered electrons 103b directed to the specimen surface, that is, the image signal amount is the largest for the crystal grain 106c and is decreased, in order, for crystal grains 106a and 106b. On the other hand, when observation is carried out with a scanning electron beam 101b' irradiating in an oblique direction as shown in FIG. 29C, the image signal amount decreases in the order of crystal grains 106c, 106b and 106a.

In this manner, the image signal amount or image contrast changes in accordance with the relation between crystal direction and observation direction. By analyzing the condition of this change, the crystal direction of each crystal grain can be decided. Through image analysis, as in the case of particle number counting, data of crystal grain size distribution and data of crystal direction distribution can be obtained.

Figure 30A:
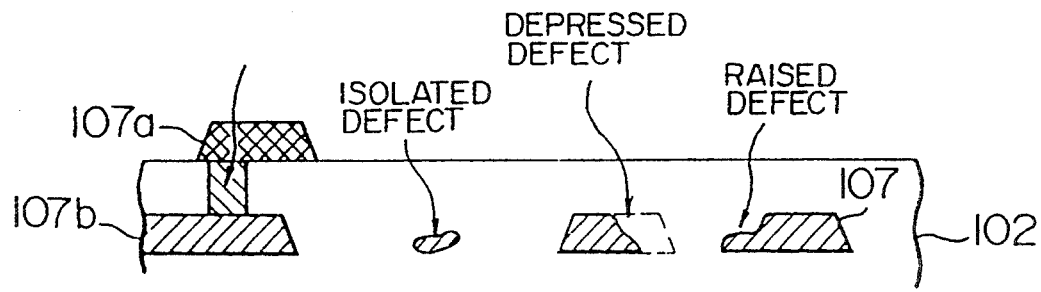
FIG. 30A is a sectional view showing examples of the kind of defects subjected to defect inspection.
Figure 30B:
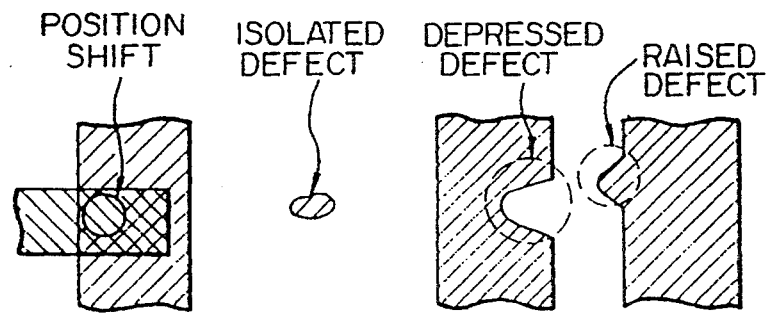
FIG. 30B is a plan view of the defects shown in FIG. 30A.
Figure 31:
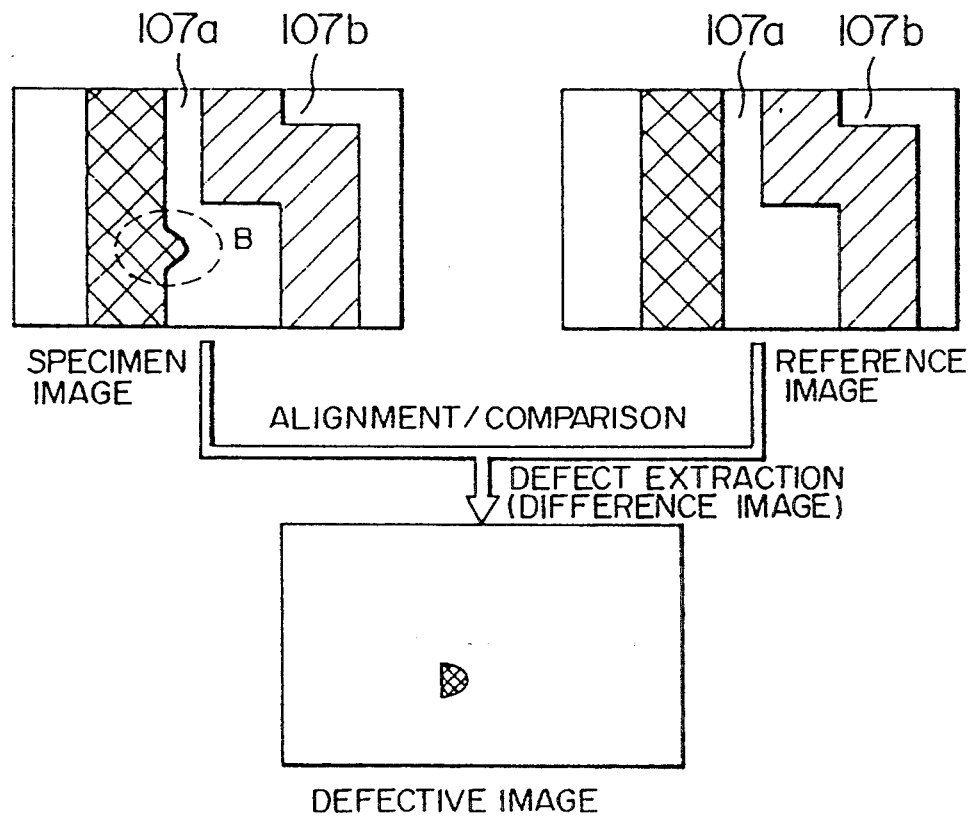
FIG. 31 is a conceptual diagram showing an embodiment of a method of performing defect inspection of a pattern in a specimen.
Figure 32:
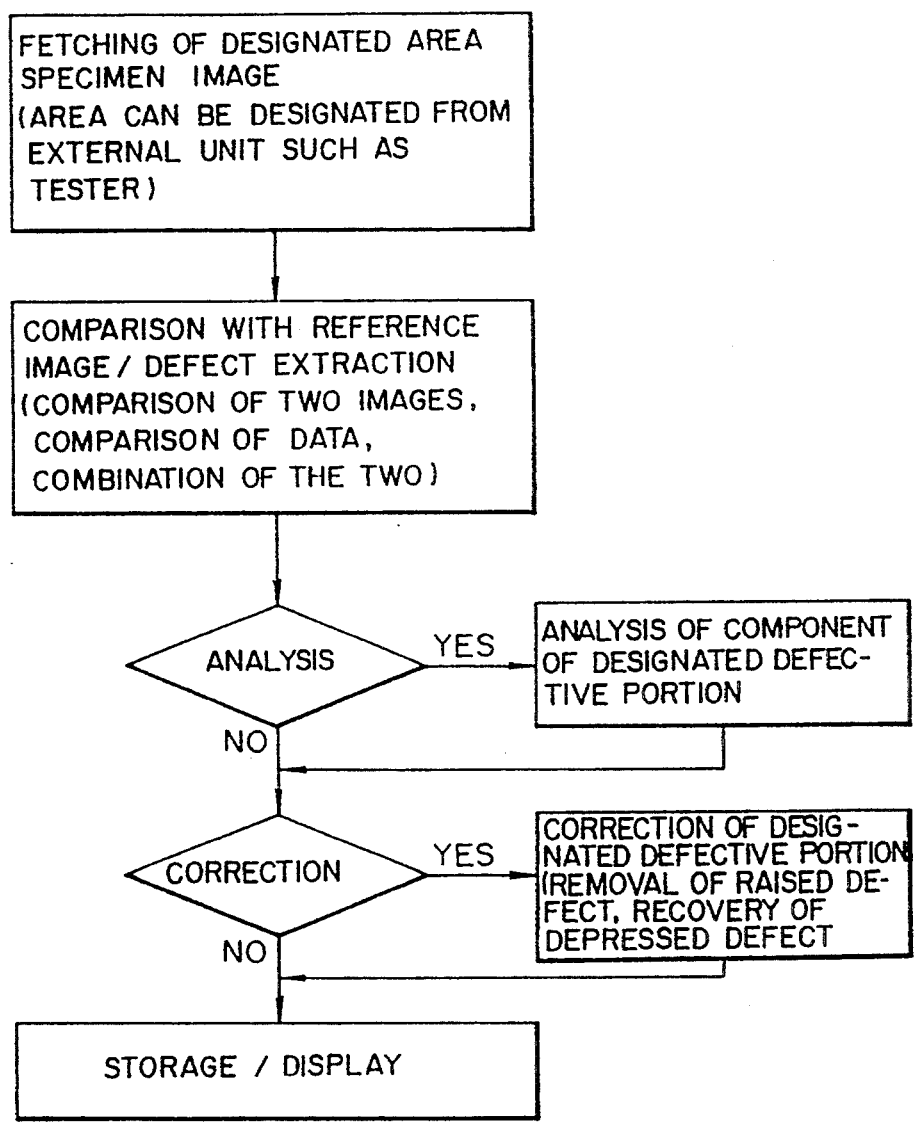
FIG. 32 is a flow chart of an embodiment of a method for performing defect inspection.

Enumerated as a third example is inspection of pattern defects and foreign matter. There are various kinds of defects as exemplified in FIGS. 30A and 30B. FIG. 30A is a sectional view of a specimen and FIG. 30B is a plan view of the specimen. In order to detect these defects, the procedure shown in FIGS. 31 and 32 is performed, which accords with a technique used in a general defect inspection apparatus.

A specimen image of a designated area is first fetched and subjected to image processing such as smoothing, and thereafter the alignment and comparison of the specimen image with a previously stored reference image is effected to provide a difference between the specimen and reference images, and a defect/foreign matter is detected from the difference. In FIG. 31, a portion B is detected as a raised defect.

The reference image may be either a standard specimen image taken within an area corresponding to a designated area of an identical specimen or within the same kind of specimen, or a pattern data image of the corresponding area prepared on the basis of pattern data. In the inspection operation, the reference image can partly be defined by a standard specimen image, and partly by a pattern data image. These images may be used in combination.

The entire surface of a wafer may be used as an inspection area, or only part of the wafer surface may be inspected. For example, position coordinate data of a chip or a circuit block, which have been decided to be unacceptable or defective through inspection based on a tester or a defect inspection apparatus, are inputted from the tester or the defect inspection apparatus on line, positions of the unacceptable chip or circuit block are determined from the inputted coordinate data, and only a portion in question is selectively subjected to defect inspection. On the other hand, even in the defect inspection, component analysis of the defective portion can be effected, as in the case of the example of particle measurement.

By using a technique similar to the removal of a covering by an etching gas, a pattern defect can be corrected. In contrast, however, to the removal of a raised defect or an isolated defect, wherein an etching gas is used, a sedimentary gas is used for correction of a depression defect. Essentially, the defect correction technique is the same as that performed by a photomask defect correction apparatus or an LSI wiring correction apparatus.

While the conventional defect inspection apparatus is in general of the optical type, the defect inspection based on a high energy electron beam is advantageous in that not only the defect detection sensitivity is high but also a defect underlying an opaque material can be detected. In particular, of the defects shown in FIGS. 30A and 30B, detection of a pattern position shift would be impossible with the conventional method, but possible with the inventive method based on the high energy electron beam.

Figure 33A:
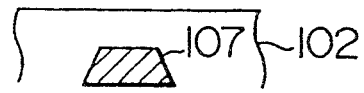
FIG. 33A is a sectional view showing a pattern in a specimen.
Figure 33B:
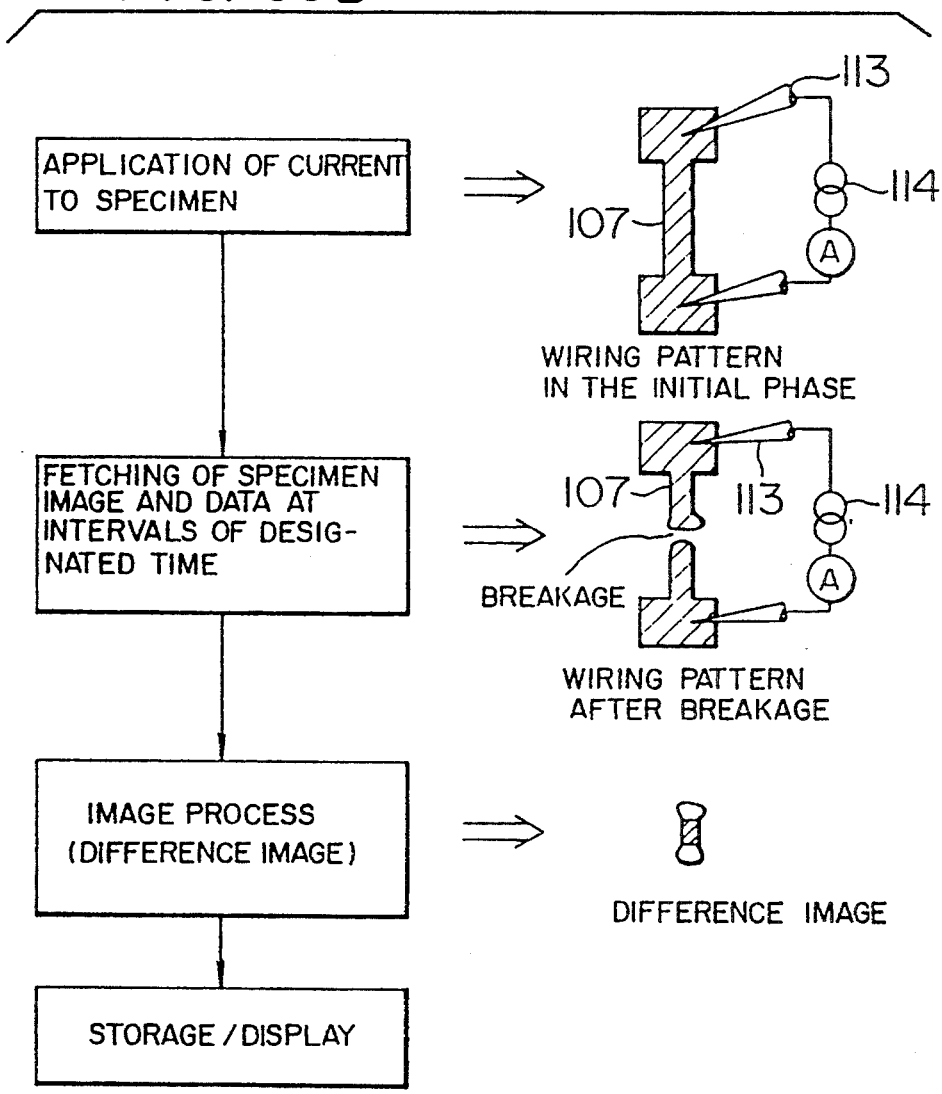
FIG. 33B is a flow chart showing an embodiment of a method of observing a change in configuration of the pattern of FIG. 33A when stress is applied to the pattern.

A fourth example is for monitoring a change in state of a specimen. FIG. 33A is a sectional view of an exemplary wiring pattern 107 embedded in the specimen. FIG. 33B shows, as an example, an application of the semiconductor device specimen to an accelerating test.

A probe 113 is put on opposite ends of the wiring pattern 107 to be monitored and a stress current is applied from a current source 114 to the wiring pattern through the probe 113. A specimen image of the wiring pattern 107 is fetched at designated time intervals and the state of wiring pattern 107 ultimately ending in breakage is recorded and displayed. For example, a difference between the preceding state and the present state is displayed to emphasize only a change. Simultaneously with the specimen image, lapse of electrical parameters such as current value and resistance value are collected, recorded and displayed. Of course, the number of probes and power supplies used can be increased in accordance with the number of wiring conductors to be monitored.

The stress applied is not limited to DC current but may also be AC current or pulse current. In addition to current, voltage or an operating electrical signal may be applied to the specimen, or the specimen can be heated or cooled to observe and monitor a change due to temperatures. In the case of heating, noises attributable to thermions or radiation from a heating unit adversely affect an image signal and must be compensated. The plurality of kinds of stress as above may be applied in combination or one at a time. A mechanism for applying the stress to the specimen accords with that used in observation with the conventional scanning electron microscope.

A fifth observation technique is for tomographic observation. This type of observation takes advantage of the fact that information obtained in the direction of depth of a specimen changes depending on the energy of the electron beam.

Figure 34:
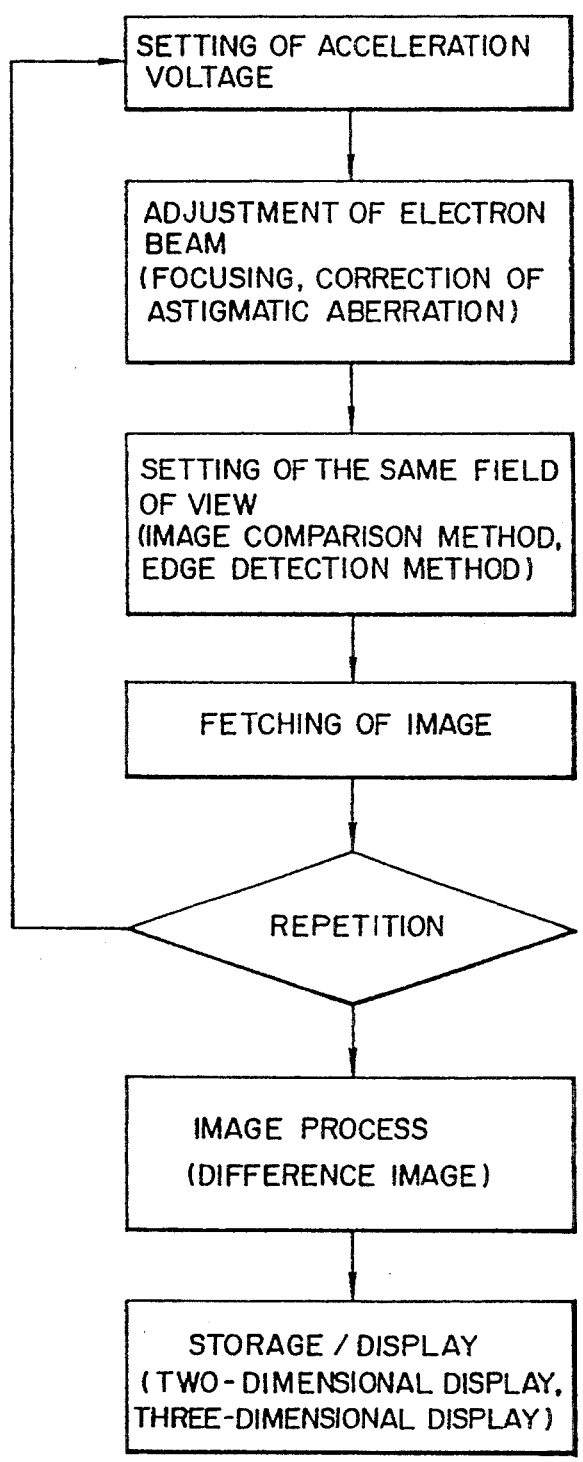
FIG. 34 is a flow chart of an embodiment of observing a three-dimensional structure of a pattern in a specimen.

FIG. 34 shows an example of a process flow. Specimen images are sequentially fetched while changing the acceleration voltage of the electron beam.

The acceleration voltage is first set. Then the electron beam is adjusted and the same field of view is settled. The electron beam adjustment is fulfilled by performing axial alignment, focusing and correction of astigmatic aberration in order to maintain high-resolution conditions. Settlement of the same field of view aims at permitting an area of the same field of view to be always observed even when the acceleration voltage is changed. For example, a method is employed wherein a specimen image previously fetched is used as a reference image, and the scanning area of the electron beam is adjusted to allow the specimen image currently under observation to coincide with the reference image. Alternatively, according to the alignment system used in the electron beam exposure apparatus, alignment can be accomplished by using an object with a designated image in place of an alignment mark.

Subsequently, a specimen image within a designated area is fetched. The higher the set acceleration voltage, the deeper a portion from which information contained in the fetched specimen image is obtained becomes.

Figure 35:
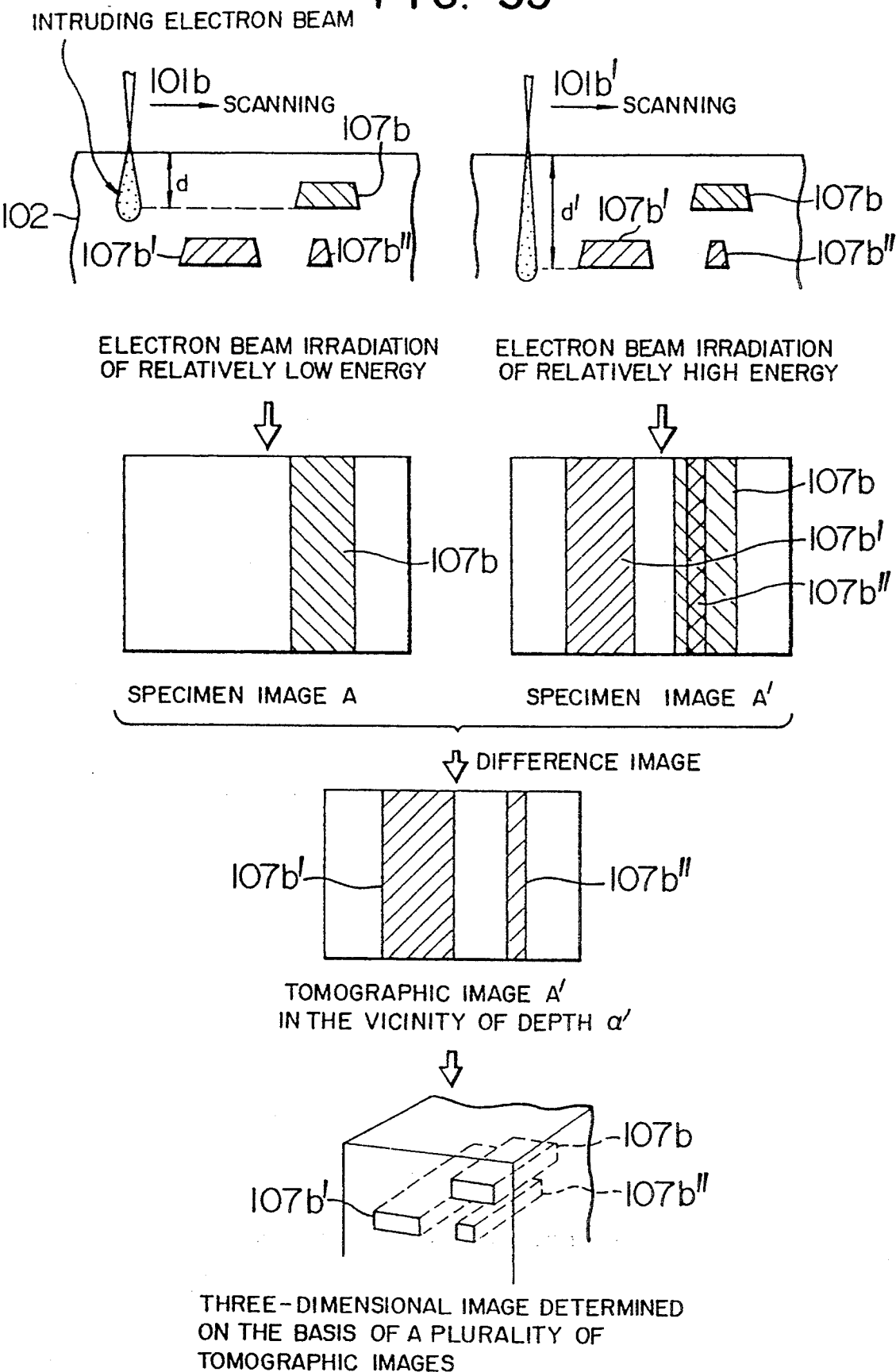
FIG. 35 is a conceptual diagram of an embodiment of observing a three-dimensional structure.

For example, an instance is considered where, as shown in FIG. 35, wiring patterns $107b$, $107b'$ and $107b''$ are inside a specimen 102.

If the set acceleration voltage is relatively low and a scanning electron beam $101b$ intrudes to a depth d, reaching the vicinity of the wiring pattern $107b$, the wiring pattern $107b$ can be seen in a specimen image A but the wiring patterns $107b'$ and $107b''$ located at deeper levels cannot be observed.

On the other hand, when a relatively high acceleration voltage is applied and the electron beam $101b'$ intrudes to a depth d' reaching the wiring patterns $107b'$ and $107b''$ the wiring patterns $107b'$ and $107b''$ can be observed in a specimen image A' obtained.

Accordingly, by preparing a difference image between the specimen images A' and A, a tomographic image A' in the vicinity of the depth d', that is, images of only the wiring patterns $107b'$ and $107b''$ can be obtained. By combining a plurality of tomographic images obtained in this manner, a three-dimensional configuration inside the specimen can be obtained.

Usually, the signal level and the degree of contrast are different for the specimen images A and A'. Therefore, in order to obtain a highly accurate difference signal, the signal level and contrast degree of the specimen image A must be overlapped with those of the specimen image A' in a pre-process.

Figure 36:
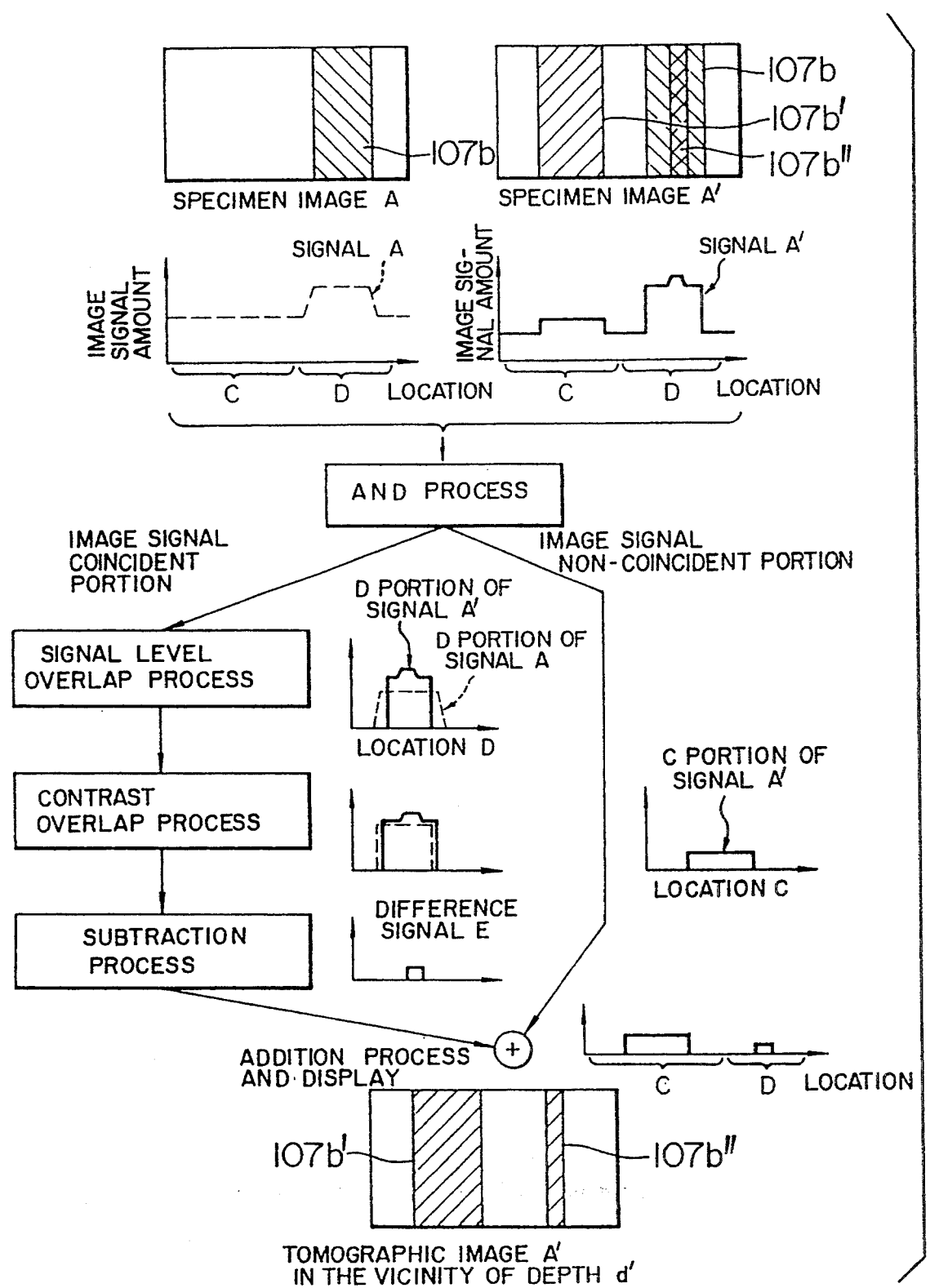
FIG. 36 is a conceptual diagram showing an embodiment of observing a sectional area of a pattern in a specimen.

FIG. 36 shows an example of the pre-process needed for determination of a difference signal. Image signals of the specimen images A and A' are first ANDed. In the AND process, each pixel of the image A is compared with each pixel of the image A' to determine the presence of an image, to provide a portion C where an image signal of only the A' image exists and a portion D where signals of both the A and A' images exist. In this case, the portion C corresponds to the wiring pattern 107b' and is used to provide a signal indicative of a tomographic image.

On the other hand, in the portion D, a signal level overlap process and a contrast overlap process are effected and then subtraction is carried out between the overlapped signal levels and between the overlapped contrast degrees. A difference signal E obtained by the subtraction corresponds to the wiring pattern 107b" and is used in combination with the signal at the portion C to provide a signal indicative of the tomographic image A'.

In the embodiments shown in FIGS. 35 and 36, the incident energy of the primary beam is changed. Additionally, by changing the incident angle of the primary beam as shown in FIGS. 25 and 26, a tomographic image or a three-dimensional image of the pattern can be formed with higher accuracy.

When a semiconductor device is irradiated with the electron beam, there arises a problem that the device is damaged by the irradiation. The irradiation damage degrades characteristics of the device, and therefore it is necessary that the damage should be mitigated or a damaged portion should be recovered.

Figure 37:
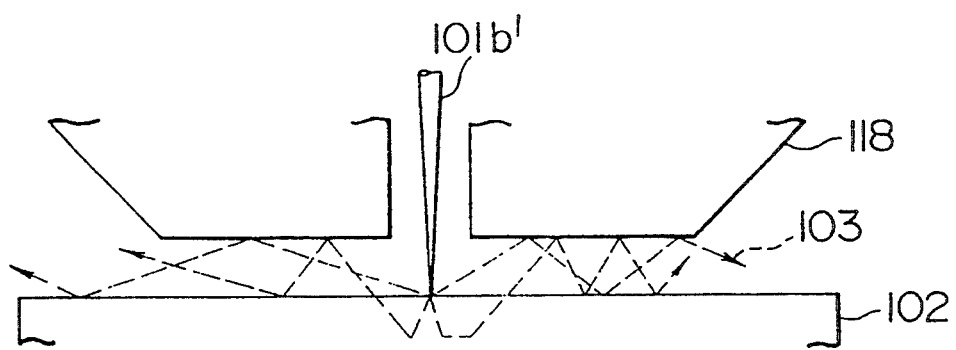
FIG. 37 is a conceptual diagram showing an example of multiple scattering of reflection electrons.

The causes of the irradiation damage have been studied to find that reflection electrons 103 of high energy undergo multiple scattering, as shown in FIG. 37, in a space between the specimen 102 and the underside of the objective lens 118 arranged above the specimen. The multiple scattering is a major cause of heavy damage.

Figure 38A:
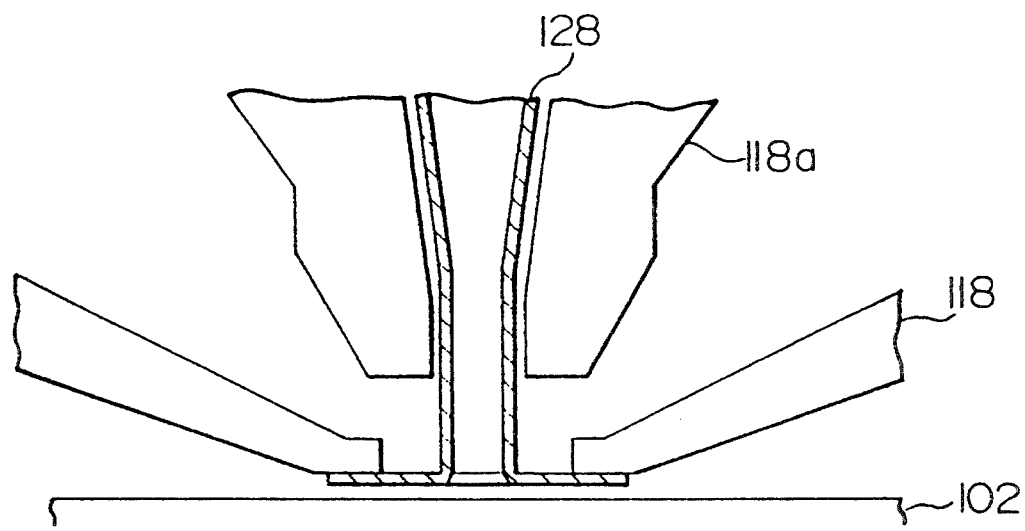
FIG. 38A is a sectional view showing the construction of a prior art objective lens.
Figure 38B:
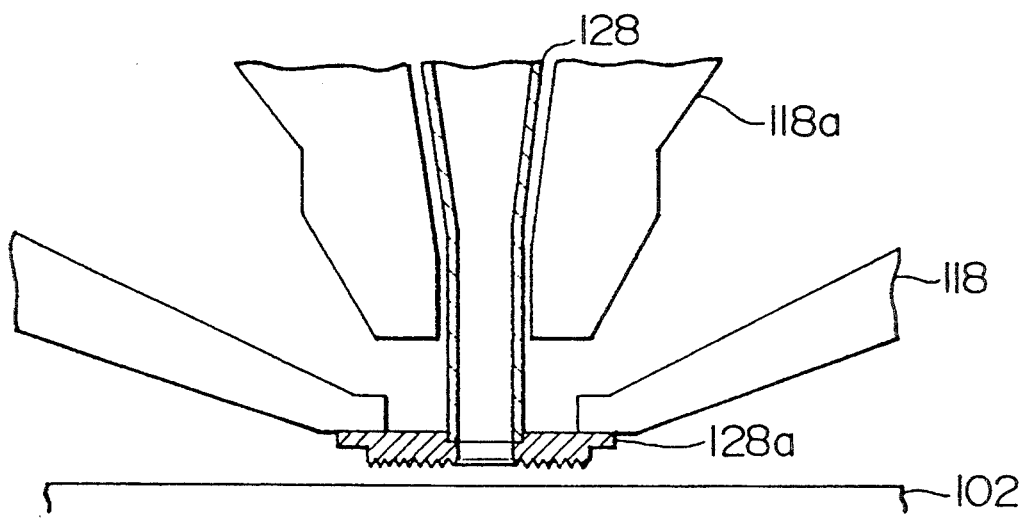
FIG. 38B is a sectional view showing the construction of an embodiment of an objective lens.

FIGS. 38A and 38B show enlarged sectional views of a specimen and an objective lens portion and are useful to study countermeasures against the multiple scattering of reflection electrons.

Conventionally, as shown in FIG. 38A, a vacuum shield pipe 128 made of phosphor bronze passes through an electron beam path defined by an upper pole piece 118a and a lower pole piece 118b of the objective lens. However, phosphor bronze has a large reflection coefficient and is liable to cause the multiple scattering.

FIG. 38B shows a technique of suppressing the multiple scattering of reflection electrons. A specimen-opposing portion 128a of vacuum shield pipe 128 facing the specimen 102 is made of carbon, which is a light element having a small reflection coefficient for electrons. The specimen-opposing portion 128a has a sawtooth-shaped sectional form, which inhibits multiple scattering of reflection electrons.

The material of the specimen-opposing portion 128a may also be a light metal material such as aluminum. The sawtooth-shaped form is not limitative and the portion 128a may have a different non-flat form, such as a comb form.

As for recovery of a portion suffering an irradiation damage, it has been confirmed that the threshold value of a MOS device shifted under the irradiation of an electron beam during observation can recover by annealing with hydrogen at 450° C. After observation, the specimen must be annealed in accordance with its application. Most preferably, the anneal process is performed immediately after observation of the specimen.

The annealing function can be fulfilled by using a heating mechanism provided to the specimen stage 121, a heating mechanism additionally provided to the loader/unloader chamber 120 or a separate unit. Heating may be of the resistance-heating type or the lamp-heating type, and a gas such as hydrogen or nitrogen may be admitted to an annealing process unit.

While the foregoing embodiments use a system wherein the secondary electron detector 124 is arranged above the objective lens 118 and secondary electrons are collected by utilizing a magnetic field of the objective lens, a different system may alternatively be employed wherein a secondary electron detector is arranged under an objective lens to apply an electric field by means of which secondary electrons are detected.

In place of the scintillator and photomultiplier tube, a secondary-electron multiplier may be used as the secondary electron detector.

X-rays, photons or absorbed electrons, other than the secondary electrons, may be detected as the secondary information which is used as a signal.

Figure 39:
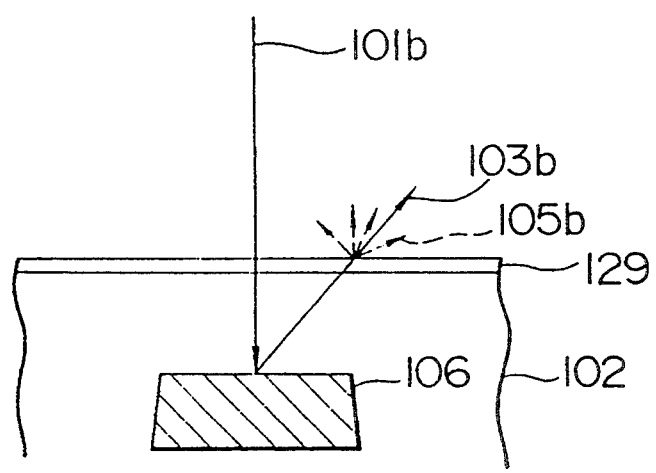
FIG. 39 is a schematic sectional diagram showing the construction and operation of the embodiment of a specimen.

In order to increase the signal amount of the secondary information, a substance liable to generate secondary electrons or fluorescence may be deposited or coated thinly on a specimen to be observed. FIG. 39 shows an example to this effect. An oxide material having a high secondary electron emission efficiency is deposited thinly on a specimen 102 to increase the number of secondary electrons generated by scattered electrons 103b. In an alternative, a fluorescent material substituting for the oxide material may be coated thinly on the specimen so that scattered electrons may cause the fluorescent material to generate fluorescence, which in turn is detected.

The specimen is not limited to a wafer, but any device built in a package may be used as a specimen.

Specimens have been described as treated in by lot, but this is not limitative and specimens may be treated sheet by sheet. The specimen has been described as mounted or dismounted manually by the operator, but instead it may be conveyed automatically to another processing unit.

Movement, rotation and inclination of a site of a specimen to be observed have been described as being effected by moving, rotating and inclining the specimen stage, but alternatively they can be accomplished by moving the irradiation position of an electron beam, rotating the electron beam irradiation area and inclining the electron beam irradiation direction.

In addition to an electron beam, other exciting beams such as an ion beam and a laser beam may be used as the particle beam.

In addition to scattered electrons, an electromagnetic wave may be used as the primary information for producing the secondary information.

The target specimen is not limited to a semiconductor device, but may be a photomask substrate, a display device, a wiring board, an optical disc, a metal material, a polymer material or a living body. With the aim of increasing contrast, such a light element as a living body can be dyed with a heavy metal.

Effects brought about by typical features of the present invention disclosed in the present application will be described briefly as follows.

According to the present invention, by utilizing the newly-found phenomena described above, conventionally-considered difficulties or impossibilities can be solved with ease. Beneficial applications will be exemplified below.

From the viewpoint of non-destructive observation, attainable advantages are: (1) structure, defects and foreign matter inside a specimen can be observed, (2) surface structures having greater and more precipitous unevenness than that observable with the prior art can be observed, (3) three-dimensional configurations of the surface and internal structures can be determined, (4) tomographic observation can be ensured, and (5) an electrically non-conductive material can be observed with higher resolution according to the present invention than in the prior art.

From the viewpoint of non-destructive inspection and measurement, attainable advantages are: (1) length and height of a pattern or structure formed inside a specimen or on the surface thereof can be measured, (2) particles, domains, bubbles and foreign materials present inside a specimen or on the surface thereof can be counted and measured, (3) pattern defects and foreign matter present inside a specimen or on the surface thereof can be inspected, (4) lapse of a change in the structure inside a specimen or on the surface thereof can be monitored on the spot, and (5) length can be measured with higher accuracy, and defects and foreign matter can be inspected with higher sensitivity in the present invention than in the prior art.

In defect inspection, work can be done more efficiently by using component analysis and defect correction.

When used in combination with another processing apparatus, the present apparatus can also be utilized as an in-line process monitor.

Further, since applications of the present techniques can solve impossibilities and difficulties, as previously considered, devices and parts of higher quality and higher reliability can be manufactured economically.

Another embodiment of the observing method will be described with reference to FIG. 40A. The previously-described scanning electron microscope can be used as an observing apparatus. Obviously, a charged particle beam may be used in place of an electron beam.

The observing method of the present embodiment is for providing such a superimposed display that a specimen image of a part of a specimen which is unseen in the direction of irradiation of an electron beam is superimposed on a specimen image of a part of the specimen which is seen in the direction of irradiation of the electron beam. In the observing method, an electron beam 202a for scanning a specimen 201 is irradiated thereon to interact with the specimen 201 to thereby generate secondary electrons 203 and secondary electrons 203a, and an image signal indicative of the secondary electrons 203 and an image signal indicative of the secondary electrons 203a are used to form a specimen image.

In this case, the electron beam 202a is used at a higher speed than an electron beam used in the prior art in order that a signal indicative of ordinary secondary electrons 203 and a signal indicative of secondary electrons 203a generated by reflection electrons scattered in the inside of the specimen 201 are employed as they are to provide a superimposed display of a specimen image of a part of the specimen which is unseen in the direction of irradiation of the electron beam 202a and a specimen image of a part of the specimen which is seen in the direction of irradiation of the electron beam 202a, and so can be displayed according to the prior art. The energy of the electron beam 202a is suitably selected in accordance with the material and structure of the specimen and may preferably be, for example, 50 KeV or more. More preferably, it may be 100 to 200 KeV.

Figure 40A:
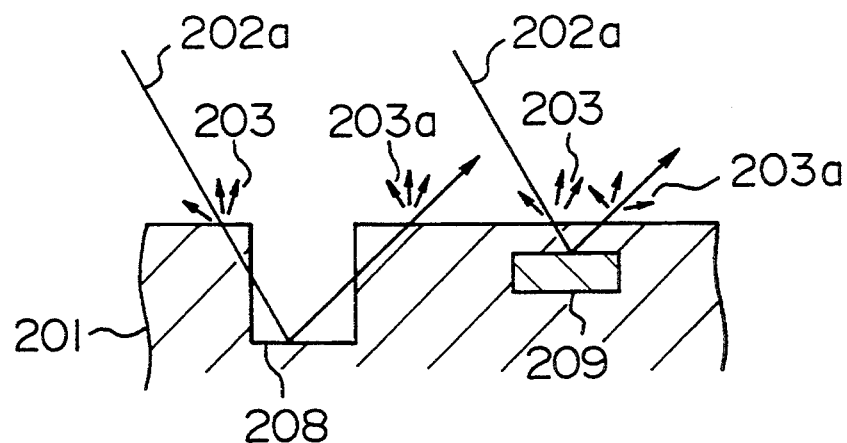
FIG. 40A is a sectional view showing the principle of signal detection in another embodiment of the observing method according to the invention.

In the specimen having the structure of FIG. 40A and made of silicon oxide, a hole has a diameter of 0.4 $\mu$m and a depth of 1.5 $\mu$m and an internal structure 209 is a line made of tungsten which is buried at a depth of 0.6 to 1.2 $\mu$m measured from the specimen surface. When such a specimen was irradiated with an electron beam 202a at 100 KeV, the specimen surface and the shapes of hole bottom 208 and line 209 could be observed at the same time.

The operation of the present embodiment will now be described by making a comparison with that of the prior art.

Figure 40B:
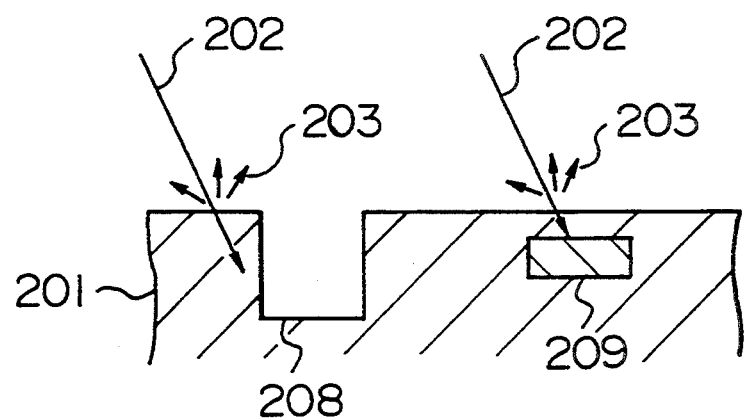
FIG. 40B is a sectional view showing a principle of signal detection in the prior art.

In the prior art, an electron beam 202 at a relatively low speed (typically at 0.5 to 20 KeV) is used and as a result, portions shaded from the electron beam take place as shown in FIG. 40B and secondary electrons 203a due to electrons reflected at the hole bottom 208 and internal structure 209, standing for the shaded portions, are not generated or are generated in a very small amount, making it impossible to observe images of these shaded portions.

In contrast, when an electron beam 202a at a high speed as in the present invention is used, the irradiated electrons have sufficient kinetic energy and as a result, the electron beam 202a can penetrate through the specimen 201, can be reflected at the hole bottom 208 and internal structure 209 and eventually can escape from the specimen 201, as shown in FIG. 40A.

In addition, upon departure from the specimen 201, a relatively large amount of reflection electrons generate secondary electrons 203a. The generation amount of the secondary electrons 203a depends on the amount and energy of the irradiated electron beam 202a. Since the electron beam 202a now reflected has information about the hole bottom 208 and internal structure 209, that is, test parts, images of the hole bottom 208 and internal structure 209 can be obtained by detecting an image signal indicative of the secondary electrons 203a.

More particularly, by detecting secondary electrons 203 and secondary electrons 203a generated by reflection electrons scattered in the inside of the specimen 201 in combination, a hole bottom part, a side wall part of a bank, a buried internal part or a conical hole part which is shaded from the electron beam 202a can be displayed in combination with such a specimen image as shown in FIGS. 41B, 42B, 43B or 44B which can be observed with the prior art, thereby permitting a display including a part unseen in the direction of irradiation of the electron beam 202a which is hatched in FIGS. 41C, 42C, 43C or 44C.

Referring now to FIGS. 45A, 45B, 46A, 46B, 47A and 47B, photographic examples of specimen images taken by the technique of the present invention will be described by making a comparison with conventional photographic examples taken with the scanning electron microscope.

In this case, the monochromatic (white/black) density is determined in accordance with generation amounts of secondary electrons 203 and 203a, and the larger the generation amounts of secondary electrons 203 and 203a, the lighter the photographed color becomes. Conversely, the smaller the generation amounts, the darker the photographed color becomes.

Figure 41A:
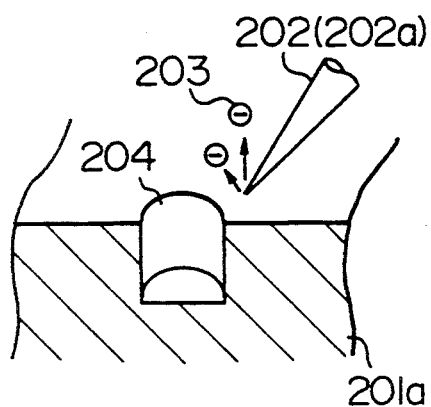
FIG. 41A is a perspective view, partly sectioned, of an essential part of a specimen having a hole structure.
Figure 41B:
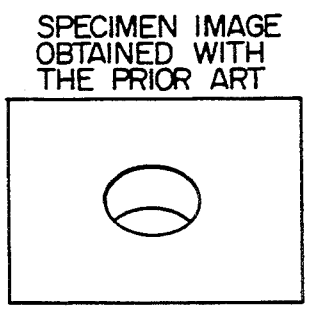
FIG. 41B is a diagram showing a specimen image obtained when the FIG. 41A specimen is observed according to the prior art.
Figure 41C:
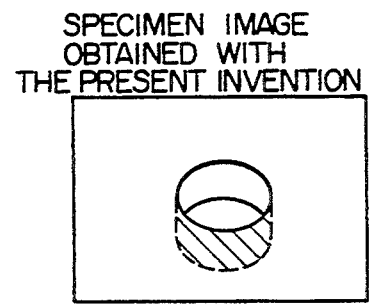
FIG. 41C is a diagram showing a specimen image observed according to the invention.
Figure 45A:
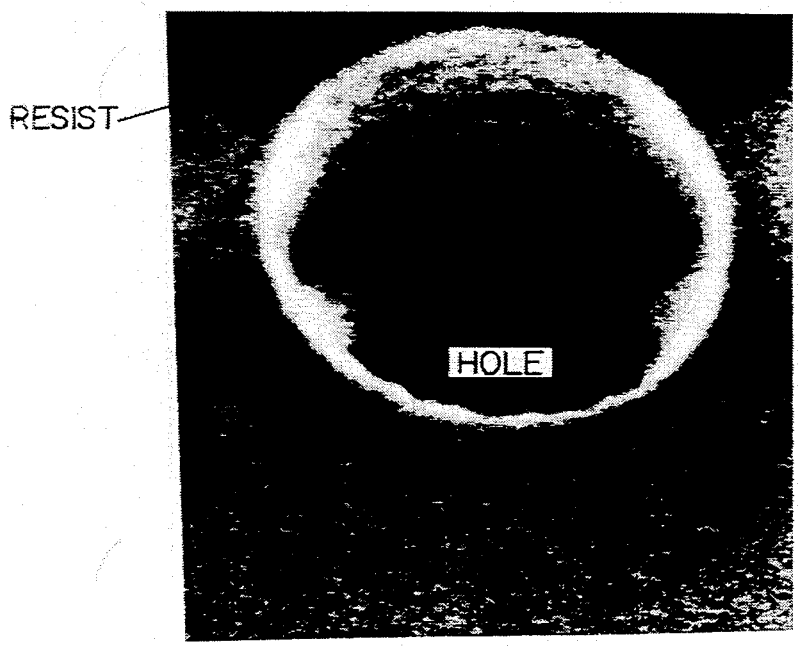
FIG. 45A shows an image photograph of a semiconductor wafer formed with a resist pattern which is photographed with a scanning electron microscope according to teachings of the prior art in connection with a specimen having a hole structure.
Figure 45B:
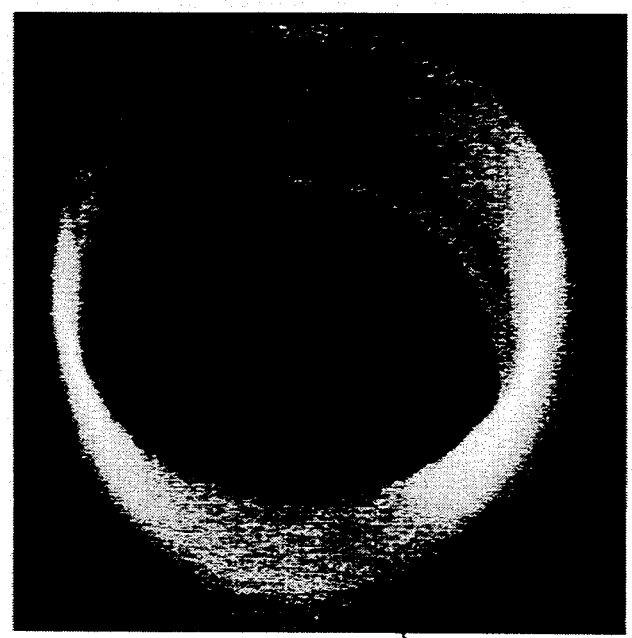
FIG. 45B shows an image photograph of the FIG. 45A semiconductor wafer photographed according to teachings of the present invention.

In obtaining the photographs shown in FIGS. 45A and 45B in connection with the specimen 201a having hole structure 204 corresponding to the structure of FIG. 41A, a hole in a resist of a resist pattern formed on a semiconductor wafer, for example, is observed with the scanning electron microscope.

In this case, with the prior art, an edge of the hole and a side wall portion which can be seen in the direction of irradiation of the electron beam are photographed in light color and the hole bottom and a resist portion surrounding the hole are photographed in dark color, as shown in FIG. 45A. The hole bottom part shaded by the hole wall from the electron beam cannot be displayed in a specimen image in this manner but according to the present embodiment, a specimen image combined with the concealed hole bottom part displayed in light color can be photographed as shown in FIG. 45B.

Figure 42A:
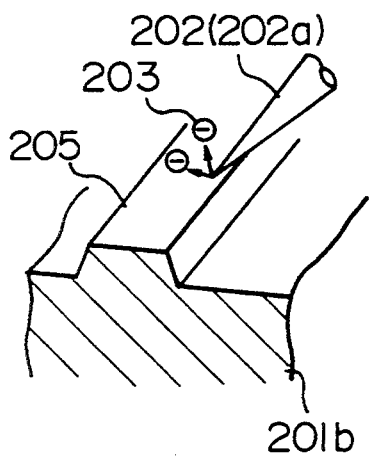
FIG. 42A is a perspective view, partly sectioned, of an essential part of a specimen having a bank structure.
Figure 42B:
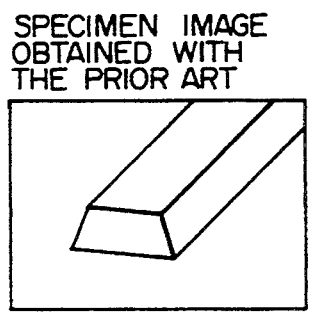
FIG. 42B is a diagram showing a specimen image obtained when the FIG. 42A specimen is observed according to the prior art.
Figure 42C:
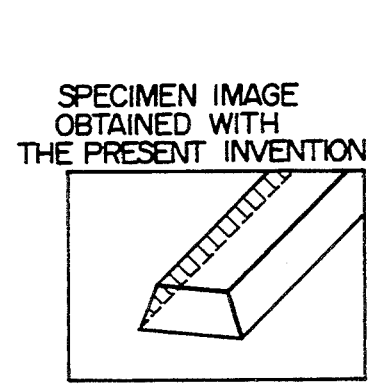
FIG. 42C is a diagram showing a specimen image observed according to the embodiment.
Figure 43A:
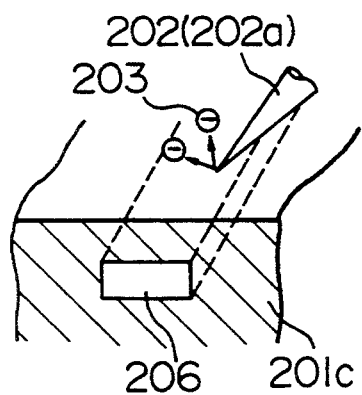
FIG. 43A is a perspective view, partly sectioned, of an essential part of a specimen having an internal structure.
Figure 43B:
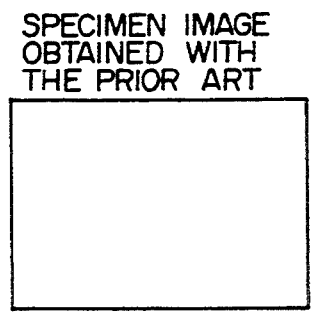
FIG. 43B is a diagram showing a specimen image obtained when the FIG. 43A specimen is observed according to the prior art.
Figure 43C:
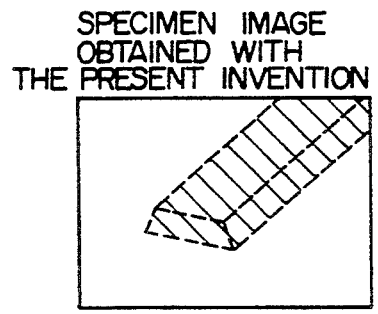
FIG. 43C is a diagram showing a specimen image observed according to the embodiment.
Figure 44A:
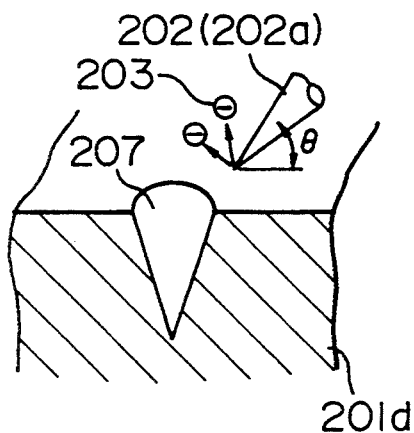
FIG. 44A is a perspective view, partly sectioned, of an essential part of a specimen having a conical hole structure.
Figure 44B:
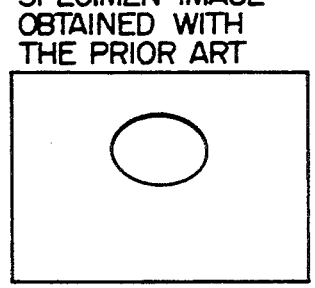
FIG. 44B shows a specimen image obtained when the FIG. 44A specimen is observed according to the prior art.
Figure 44C:
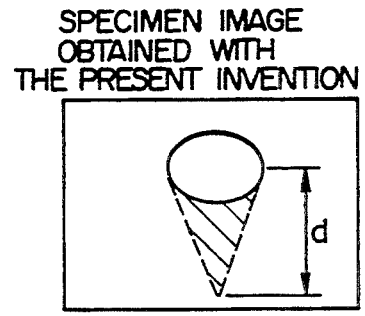
FIG. 44C shows a specimen image observed according to the embodiment.

In connection with a specimen 201b having a bank structure 205 as shown in FIG. 42A, a semiconductor wafer formed with a resist pattern is observed as in the case of the photographs of FIGS. 45A and 45B to obtain a photograph as shown in FIG. 46B which demonstrates that a side wall of resist at a position opposite to an electron beam and shaded therefrom can be photographed and observed in lighter color as compared to a photograph of FIG. 46A taken with the prior art. Further, in the photograph of FIG. 46B, a depressed portion of a contact hole standing for an inner structure can be photographed in darker color than the surface resist portion.

Figure 47A:
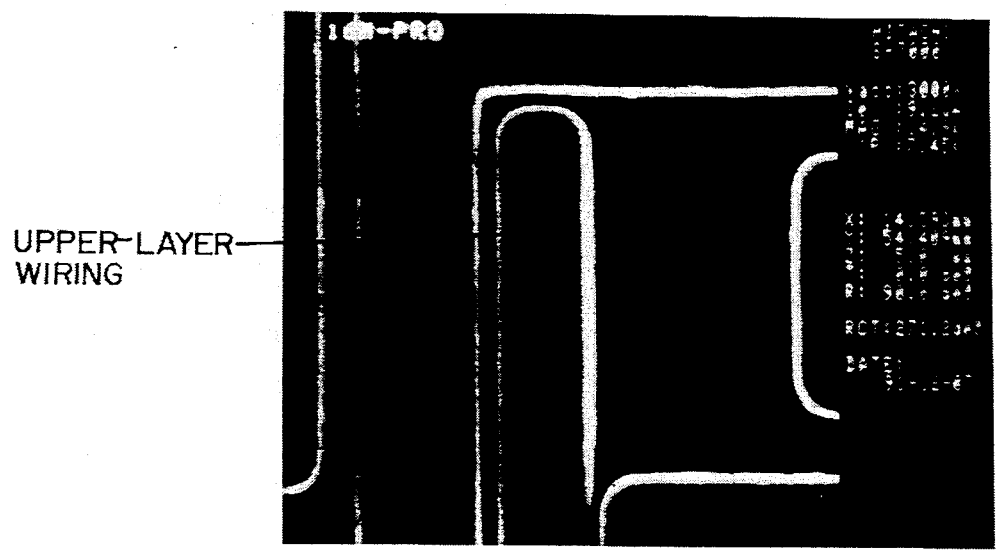
FIG. 47A shows an image photograph of a semiconductor wafer formed with wiring patterns which is photographed with the scanning electron microscope according to teachings of the prior art in connection with a specimen having an internal structure.
Figure 47B:
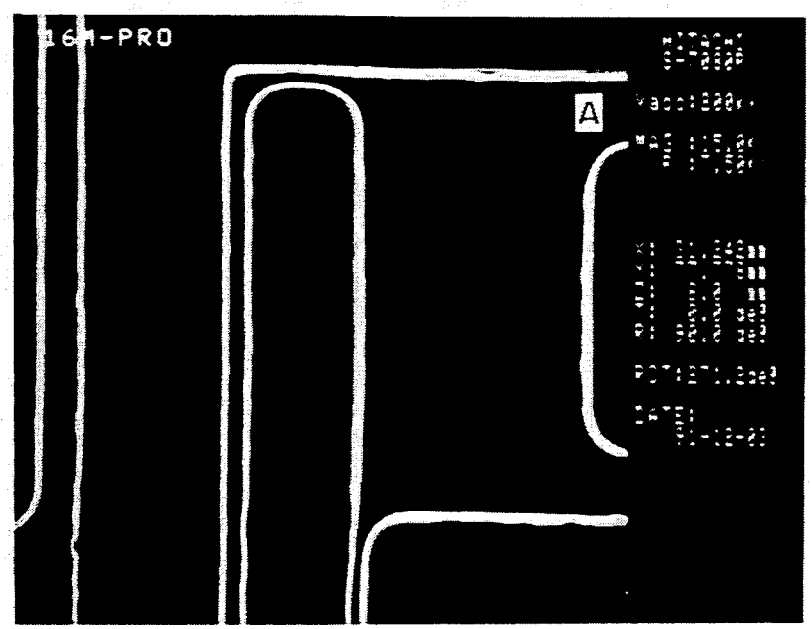
FIG. 47B shows an image photograph of the FIG. 47A semiconductor wafer photographed according to teachings of the present invention.

A wiring pattern having, for example, a two-layer wiring structure is photographed to obtain photographs as shown in FIGS. 47A and 47B. In the photograph of FIG. 47A taken with the prior art, only a side wall of surface wiring is photographed in light color but an internal structure cannot be photographed in dark and light color and the presence of an internal structure cannot even be inferred. In the present embodiment, however, as shown in FIG. 47B, even the undersurface wiring buried internally can be photographed in lighter color than its surroundings and can be observed in combination with the surface upper-layer wiring.

Observation conditions for the photograph shown in FIG. 47A are as follows: acceleration voltage: 3 keV; emission current: 10 μA; magnification in observation (magnification on photograph): ×15K (×6.35); inclination of specimen: 0°; and working distance: 5 mm (minimum). Thereby, the shape of a PRO layer is only observed. The shape observed shows ups and downs reflecting a wiring M2 (see FIG. 47C).

Figure 47C:
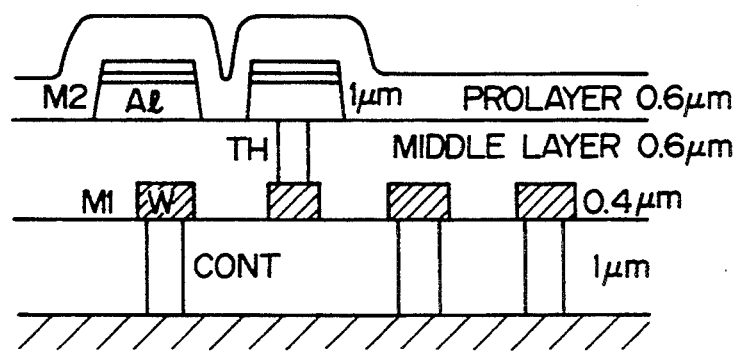
FIG. 47C shows a schematic sectional view of the semiconductor wafer of FIG. 47B.

Observation conditions for the photograph shown in FIG. 47B are as follows: acceleration voltage: 200 keV; emission current: 10 μA; magnification in observation (magnification on photograph): ×15K (×7.5); inclination of specimen: 0°; and working distance: 8 mm (minimum). Thereby, the shape of a PRO layer is observed. The shape observed shows ups and downs reflecting wiring M2. Furthermore, FIG. 47C shows shapes of the wiring M2, a wiring M2 in a middle layer, and holes of CONT that are observed. It is difficult to observe the shape of a hole right under the wiring M2.

Thus, in accordance with the image display method of the present embodiment, by using as they are a signal indicative of ordinary secondary electrons 203 and a signal indicative of secondary electrons 203a due to reflection electrons scattered in the inside of a specimen 201 under the application of an electron beam 202a at a very high speed, a specimen image of a specimen part which is unseen in the direction of irradiation of the electron beam 202a can be displayed while being superimposed on a specimen image of a specimen part which is seen in the direction of irradiation of the electron beam 202a and so can be displayed with the prior art, thereby making it possible to observe a display including the part which cannot be seen with the conventional method.

The image observing method of the present embodiment has been described as being exemplified such that a signal indicative of secondary electrons 203a due to reflection electrons scattered in the inside of a specimen 201 is used, as it is, as an information source for displaying a part which is unseen in the direction of irradiation of an electron beam 202a, but the present invention is in no way limited to the foregoing embodiment and may also be applied widely to other methods as described below.

More particularly, in the case where an image signal indicative of reflection electrons or X-rays generated from a specimen under the application of an electron beam is utilized as an information source for displaying an unseen part as in the foregoing embodiment, a method may be employed wherein the signal indicative of reflection electrons or X-rays is processed and then used for image display.

In this case, in addition to, for example, a specimen image due to ordinary secondary electrons, an image due to X-rays may be fetched, the two images are compared with each other to calculate information about a concealed part such as an internal structure, and the thus calculated information may be displayed while being superimposed on the image due to ordinary secondary electrons. Further, secondary electrons resulting from interaction of Y-rays or secondary electrons generated from a test part such as hole bottom 208 or internal structure 209 with the surface of a specimen may be used to form an image, and this image may be superimposed on a surface image of the specimen.

Further, a method may be employed wherein design information such as pattern/structure data of LSI is used as an image signal. For example, as shown in FIG. 48, pattern data concerning a specimen and device structure information are previously stored in a data base (memory 210), information about the observing direction/position, inclination and area of an image observing field is detected by a controller 214 when performing observation with a scanning electron microscope 215, and the data are read out of the data base 210 and subjected to computer graphic processing by means of an image generator 212. A graphic image thus obtained is superimposed on an image produced from the scanning electron microscope 215 by means of a composer 213 and displayed on a display 216. In this case, the irradiation energy of an electron beam in the scanning electron microscope 215 is determined for exclusive use in observation of the specimen surface and is of 0.5 to 20 KeV.

Furthermore, when performing display of the specimen image as above, display of the concealed part may be characterized by, for example, color display or contour display.

While in the foregoing description, the present invention has been described as being applied mainly to the scanning electron microscope used for fabricating semiconductor wafers, it is not limited thereto and may also be applied widely to related apparatus or similar apparatus using a scanning electron microscope and to all of the fields utilizing these apparatus; especially, the invention may be applied preferably to the case where observation of a specimen inclusive of a part thereof which is unseen in the direction of irradiation of an electron beam is needed.

Briefly, effects brought about by the present embodiment are as follows.

More particularly, by providing a superimposed display of a specimen image of a specimen part which is seen in the direction of irradiation of an electron beam and a specimen image of a specimen part which is unseen in the direction of irradiation of the electron beam, a part which cannot be observed using only an ordinary secondary electron image can be displayed, and therefore a greater amount of information, including, for example, cubic shapes and three-dimensional sizes, can be obtained.

Consequently, a display method for a specimen image in a scanning electron microscope can be provided which can visualize a part conventionally unseen by the scanning electron microscope and can widen and deepen knowledge obtained from a specimen image.

Although the present invention has been described in detail, it should be understood that various changes, substitutions and alterations can be made hereto without departing from the spirit and scope of the present invention as defined by the appended claims.

What is claimed is:

1. A scanning electron microscope, comprising:
   means for irradiating a primary electron beam to an object to be inspected, the primary electron beam having energy sufficient to produce reflection electrons, reflected from within a depression in the object, that penetrate through the object so as to escape from the surface of the object, or that generate secondary electrons in the surface of the object while penetrating through the object; and
   means for detecting the escaped reflection electrons or the secondary electrons.

2. A scanning electron microscope according to claim 1, wherein the detection means detects the secondary electrons generated in the surface of the object by the reflection electrons.

3. A scanning electron microscope according to claim 1, wherein the detection means detects the reflection electrons.

4. A scanning electron microscope according to claim 1, wherein the irradiation means for the primary electron beam includes a final lens for focusing the beam, and further comprising an electron-ray detector above the final lens, wherein the secondary electrons pass through the final lens before being detected by the electron-ray detector.

5. A scanning electron microscope according to claim 1, further comprising means for imaging the surface of the object to be inspected according to detection signals generated by the detecting means, wherein the detection signals result from an arithmetic operation on the reflection electrons or the secondary electrons.

6. A scanning electron microscope according to claim 1, wherein the energy of the primary electron beam exceeds 50 keV, and further comprising a stage into which the object having a diameter in excess of 4 inches can be inserted and which is adjustable in inclination angle.

7. A semiconductor fabrication apparatus as claimed in claim 1, wherein the detecting means includes separate means for detecting the escaped reflection electrons and means for detecting the secondary electrons, and wherein the separate detecting means respectively and simultaneously detect the escaped reflection and secondary electrons.

8. A scanning electron microscope, comprising:
   means for irradiating a primary electron beam to an object to be inspected, the primary electron beam having sufficient energy to transmit through the object to be inspected, and the transmitted beam causing secondary electrons to be emitted from the undersurface of the object; and
   means for detecting the transmitted beam or the secondary electrons.

9. A method for production of a semiconductor device, comprising the steps of:
   etching a semiconductor device to form a depression;
   irradiating a primary electron beam to the device, the primary electron beam having energy sufficient to produce reflection electrons, reflected from within the depression in the device, that penetrate through the device so as to escape from the surface of the device, or that generate secondary electrons in the surface of the device by the reflection electrons while penetrating through the device; and
   detecting the reflection electrons or the secondary electrons.

10. A semiconductor fabrication apparatus, comprising:
    a first chamber in which an object has its surface manufactured;
    a second chamber in which the object is inspected;
    means for irradiating a primary electron beam to the object to be inspected, the primary electron beam having energy sufficient to produce reflection electrons, reflected from within a depression in the object, that penetrate through the object so as to escape from the surface of the object, or that generate secondary electrons in the surface of the object while penetrating through the object;
    means for connecting the first chamber and the second chamber; and
    means for transporting the object from the first chamber to the second chamber.

11. A semiconductor fabrication apparatus as claimed in claim 10, wherein the first and second chambers and the connecting means are maintained at near-vacuum pressure.

12. A semiconductor fabrication apparatus as claimed in claim 11, wherein the connecting means includes an intermediate chamber through which the object is transported, said intermediate chamber including switching valve means for selectively exposing the intermediate chamber atmosphere to the atmosphere of one of the first and second chambers.

13. A method of displaying a scanning image of a specimen, comprising the steps of:
    irradiating a scanning particle beam to a specimen; and
    forming an image of said specimen by using, as a main image forming signal, secondary information resulting from interaction of primary information with said specimen, said primary information being generated as a result of interaction of said scanning particle beam with said specimen during said irradiating step.

14. A method according to claim 13, wherein said primary information is one of back-scattered particles, X-rays and photons, and said secondary information is one of secondary electrons and photons.

15. A method according to claim 13, wherein said scanning particle beam is an electron beam having an energy level of 50 keV or more, said primary information is back scattered electrons generated by the irradiation of said specimen with said electron beam, and said secondary information is one of secondary electrons and electromagnetic waves generated as a result of interaction of said back scattered electrons with said specimen during said irradiating step.

16. A method according to claim 13, wherein said irradiating step is performed using at least two scanning particle beams which are different from each other in at least one of incident energy and incident angle, wherein said forming step produces at least two image forming signals in accordance with said irradiation by at least two scanning particle beams, and further comprising the step of forming one of a tomographic image and a three-dimensional image of said specimen on the basis of said at least two image-forming signals.

17. A method of observing a test part of a specimen, comprising the steps of:
irradiating a first scanning particle beam to a test part of a specimen, the test part being located below the surface of said specimen; and
observing said test part using secondary information resulting from interaction of first primary information with a part of said specimen different from said test part, said first primary information being generated as a result of interaction of said first scanning particle beam with said test part.

18. A method according to claim 17, further comprising the steps of forming an image of said test part by using said secondary information.

19. A method according to claim 18, wherein the forming step is carried out to form first and second images of said test part, the method further comprising the step of comparing the first image of said test part formed in said forming step with the second image of said test part to extract a differing portion between said first and second images.

20. A method according to claim 17, further comprising the step of obtaining physical characteristics of said test part from said secondary information.

21. A method according to claim 17, wherein said first scanning particle beam is an electron beam having an energy level of 50 keV or more, said first primary information is back-scattered electrons generated in said test part by the irradiation of said electron beam, and said secondary information is one of secondary electrons and electromagnetic waves generated as a result of interaction of said back-scattered electrons with the part of said specimen different from said test part.

22. A method according to claim 17, wherein said specimen is a semiconductor wafer, said method further comprising the step of adjusting the position of said wafer such that said scanning particle beam is irradiated to a portion of said wafer inclusive of said test part.

23. A method according to claim 22, further comprising the step of changing the energy of said scanning particle beam during said irradiating step.

24. A method according to claim 17, wherein said test part is a first wiring pattern.

25. A method according to claim 24, further comprising the step of irradiating said scanning particle beam to a second wiring pattern formed on said specimen surface and observing said second wiring pattern on the basis of second primary information generated as a result of interaction of said second wiring pattern with said scanning particle beam.

26. A method according to claim 17, wherein the step of irradiating to said test part is further performed using a second scanning particle beam which is different from said first scanning particle beam in at least one of incident energy and incident angle, wherein second primary information is generated as a result of interaction of said second scanning particle beam with said test part, wherein secondary information is also produced by said irradiating to said test part of said second scanning particle beam, and further comprising the step of forming one of a tomographic image and a three-dimensional image of said test part on the basis of said secondary information from both of said first and second scanning particle beams.

27. A method according to claim 26, wherein said test part is a wiring pattern.

28. A method according to claim 26, further comprising the step of displaying a particle located in said test part, said particle including a material having a coefficient of back scattering different from that of said specimen, as said one of a tomographic image and a three-dimensional image.

29. A method according to claim 28, further comprising the step of:
measuring said second primary information to identify a component of said particle.

30. A method according to claim 29, wherein said second primary information is characteristic X-rays.

31. A method according to claim 29, further comprising the step of removing said specimen present on said particle by etching.

32. A method according to claim 36, wherein said test part includes a material having at least two different partial crystalline structures, and tomographic images or three-dimensional images of partial areas formed in said forming step have degrees of contrast corresponding to said crystalline structures.

33. A method according to claim 17, further comprising the step of forming, on the surface of said specimen, a layer made of a material which generates a portion of said secondary information upon irradiation during said irradiating step.

34. A method of observing a test part below the surface of a specimen and surrounded by said specimen, comprising the steps of:
irradiating a scanning particle beam to a portion of said specimen inclusive of said test part, said scanning particle beam having energy sufficient to penetrate through said specimen surrounding said test part on an optical path and to reach said test part; and
observing said test part using secondary information resulting from interaction of primary information with a part of said specimen different from said test part, said primary information being generated as a result of interaction of said scanning particle beam with said test part during said irradiating step.

35. A method according to claim 34, further comprising the step of adjusting the incident energy of said scanning particle beam on the basis of at least one of density and thickness of a portion of said specimen which is between a surface of said specimen and the test part and through which said scanning particle beam penetrates.

36. A method according to claim 34, further comprising the step of adjusting the incident energy of said scanning particle beam on the basis of the degree of scattering at a portion of said specimen which is between said specimen surface and the test part and through which said scanning particle beam penetrates, and on the degree of back scattering at said test part.

37. A method of observing a change in the state of a test part of a specimen present below the surface of the specimen, comprising the steps of:

applying stress to said test part;

irradiating a scanning particle beam to said test part; and observing said test part using secondary information resulting from interaction of primary information with a part of said specimen different from said test part, said primary information being generated as a result of interaction of said scanning particle beam with said test part.

38. In a method for producing a semiconductor device made from a wafer having a constituent element which is below the surface and required to be observed, the improvement comprising the steps of:

irradiating a scanning particle beam to said constituent element; and observing said constituent element using secondary information resulting from interaction of primary information with a portion of said wafer other than said constituent element, said primary information being generated as a result of interaction of said scanning particle beam with said constituent element.

39. A method according to claim 38, further comprising the step of forming, on the surface of said wafer, a layer made of a material which generates a portion of said secondary information upon irradiation during said irradiating step.

40. A method according to claim 38, further comprising, after the observing step, the step of annealing the wafer.

41. An apparatus for displaying a scanning image of a specimen, comprising:

means for irradiating a scanning particle beam to a specimens to produce primary information;

means for interacting said primary information with said specimen to produce second information which is different to said first information;

means for detecting said secondary information resulting; and means for forming an image of said specimen on the basis of the detected secondary information, and for displaying said image.

42. An apparatus for observing a test part located below the surface of a specimen, comprising:

means for irradiating a scanning particle beam to said test part to produce primary information; means for interacting said primary information with a portion of said specimen other than said test part to produce second information;

means for detecting said secondary information; and means for forming an image of said specimen on the basis of the detected secondary information, and for displaying said image.

43. An apparatus according to claim 42, wherein said irradiating means scans said test part with an electron beam having an energy level of 50 keV or more.

44. An apparatus according to claim 43, further comprising means for annealing the specimen.

45. An apparatus according to claim 42, wherein said irradiating means includes a portion facing said specimen, and wherein said facing portion is made of a light element.

46. An apparatus according to claim 45, wherein said light element is carbon.

47. An apparatus according to claim 45, wherein said facing portion has a non-flat form.

48. An apparatus according to claim 42, further comprising means for providing a layer, on the surface of said specimen, made of a material for generating a portion of said secondary information upon irradiation by said irradiating means.

49. An apparatus according to claim 47, wherein said material for generating a portion of said secondary information is one of an oxide material having a large secondary electron emission amount and a fluorescent material.

50. An apparatus for observing a test part located below the surface of a specimen and surrounded by said specimen, comprising:

means for irradiating a scanning particle beam to a portion of said specimen inclusive of said test part, said scanning particle beam having energy sufficient to penetrate through said specimen surrounding said test part on an optical path and to reach said test part to produce primary information.

means for interacting said primary information with a portion of said specimen other than said test part to produce a second information;

means for detecting said secondary information resulting, and means for forming an image of said specimen on the basis of the detected secondary information, and for displaying said image.

51. An apparatus for display of a scanning image of a specimen, comprising:

irradiating means for irradiating a scanning particle beam on said specimen to produce first, second and third informations;

first image forming means for forming a first image of a part of the specimen surface which is seen in the direction of irradiation of said scanning particle beam by using said first information resulting from interaction of said scanning particle beam with the specimen surface;

means for interacting said primary information with a portion of said specimen other than said test part to produce second information;

second image forming means for forming a second image of a desired part of said specimen which is unseen in the direction of irradiation of said particle beam by using said third information; and means for forming a third image which is a superimposed image of said first and second images.

52. An apparatus according to claim 51, wherein said irradiating means causes said scanning particle beam to transmit through the surface of said specimen so that said scanning particle beam reachs the desired part and interacts with said desired part to generate said second information which in turn interacts with the specimen surface to generate said third information, and said second image forming means forms said second image by using said third information.

53. An apparatus according to claim 52, wherein said scanning particle beam is an electron beam.

54. An apparatus according to claim 53, wherein the irradiation energy of said electron beam is 50 KeV or more.

55. An apparatus according to claim 53, wherein the irradiation energy of said electron beam is 100 to 200 KeV.

56. An apparatus according to claim 52, wherein said first information is secondary electrons generated in the specimen surface, said second information is reflection electrons, or X-rays generated at the desired part, and said third information is secondary electrons generated in the specimen surface.

57. An apparatus according to claim 51, further comprising means for storing design information of the desired part,
wherein said second image forming means forms said second image by using said design information.

58. An apparatus according to claim 57, wherein said scanning particle beam is an electron beam and said first information is secondary electrons.

59. An apparatus according to claim 58, wherein said electron beam generates said secondary electrons from substantially only the specimen surface.

60. An apparatus according to claim 59, wherein said electron beam has an irradiation energy of 0.5 to 20 KeV.

61. A method for display of a scanning image of a specimen, comprising the steps of:
irradiating a scanning particle beam on said specimens to produce first, second and third informations;
forming a first image of a part of the specimen surface which is seen in the direction of irradiation of said scanning particle beam by using said first information resulting from interaction of said scanning particle beam with the specimen surface of said specimen;
forming a second image of a desired part of said specimen which is unseen in the direction of irradiation of said scanning particle beam by using said third information resulting from interaction of said second information with said specimen surface; and
forming a third image which is a superimposed image of said first and second images.

62. A method according to claim 61, wherein said irradiating step causes said scanning particle beam to transmit through the specimen surface so that said scanning particle beam reaches the desired part and interacts with said desired part to generate said second information which in turn interacts with the surface of said specimen to generate said third information, said second image forming step forms said second image by using said third information, and said third image forming step superimposes said first and second images by displaying them on the same screen at the same time.

63. A method according to claim 62, wherein said particle beam is an electron beam.

64. A method according to claim 63, wherein the irradiation energy of said electron beam is 50 KeV or more.

65. A method according to claim 63, wherein the irradiation energy of said electron beam is 100 to 200 KeV.

66. A method according to claim 62, wherein said first information is secondary electrons generated in the surface of said specimen, said second information is reflection electrons, or X-rays generated at the desired part, and said third information is secondary electrons generated in the specimen surface.

67. A method according to claim 61, further comprising said second image forming step forms said second image by using design information of the desired part, said design information being stored previously.

68. A method according to claim 67, wherein said scanning particle beam is an electron beam and said first information is secondary electrons.

69. A method according to claim 68, wherein said electron beam generates said secondary electrons from substantially only the specimen surface.

70. A method according to claim 69, wherein said electron beam has an irradiation energy of 0.5 to 20 KeV.

* * * * *

UNITED STATES PATENT AND TRADEMARK OFFICE
CERTIFICATE OF CORRECTION

PATENT NO. : 5,412,210
DATED : May 2, 1995
INVENTOR(S) : H. TODOKORO et al

It is certified that error appears in the above-indentified patent and that said Letters Patent is hereby corrected as shown below:

On the Title page, item [75];
add sixth inventor —Sadao Terakado—.

Signed and Sealed this

Twentieth Day of February, 1996

Attest:

Attesting Officer

BRUCE LEHMAN

Commissioner of Patents and Trademarks